(12) United States Patent
Ninomiya et al.

(10) Patent No.: US 7,317,999 B2
(45) Date of Patent: Jan. 8, 2008

(54) METHOD OF MAPPING LINEARLY SPACED SPECTRUM POINTS TO LOGARITHMICALLY SPACED FREQUENCY AND A MEASURING APPARATUS USING THE METHOD

(75) Inventors: Kazuhiko Ninomiya, Kobe (JP); Yoshiyuki Yanagimoto, Kobe (JP)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 11/102,409

(22) Filed: Apr. 8, 2005

(65) Prior Publication Data

US 2005/0240367 A1    Oct. 27, 2005

(30) Foreign Application Priority Data

Apr. 21, 2004  (JP) .............................. 2004-124969

(51) Int. Cl.
*G06F 19/00* (2006.01)

(52) U.S. Cl. .............................. 702/76; 381/92; 702/77; 704/241

(58) Field of Classification Search ................. 702/66, 702/72, 76, 77, 109; 700/280; 704/219, 704/241; 708/403; 375/353, 226; 381/92
See application file for complete search history.

(56) References Cited

U.S. PATENT DOCUMENTS 5,051,916 A * 9/1991 Benson ........................ 702/76
5,224,170 A * 6/1993 Waite, Jr. .................... 381/92
5,583,784 A   12/1996 Kapust et al. ................ 702/77
5,583,961 A * 12/1996 Pawlewski et al. ......... 704/241
6,760,674 B2 * 7/2004 Bombard ..................... 702/76

FOREIGN PATENT DOCUMENTS

| DE | 31 48 735 | 3/1992 |
| DE | 43 16 297 | 4/1994 |
| JP | 2003-287555 | 10/2003 |

OTHER PUBLICATIONS

Kikuchi, et al., "*A Study on Construction of Measurement System and Data Acquisition in Phase Noise Measurement Method Which Uses Cross-Correlation Processing*", The Institute of Electrical Engineers of Japan, material of Measurement Study Group IM-01-12, Jan. 14, 2002, pp. 13-18.
Fest, et al., "*Individual Characterization of an Oscillator by Means of Cross-Correlation or Cross-Variance Method*"; I.E.E.E. Transactions on Instrumentation and Measurement, Stp. 1983, vol. 32, pp. 447-450, Institute of Electrical and Electronics Engineers.

* cited by examiner

*Primary Examiner*—Bryan Bui
*Assistant Examiner*—John Le
(74) *Attorney, Agent, or Firm*—Marc Bobys

(57) ABSTRACT

A method for mapping a spectrum obtained from signals under test corresponding to linearly spaced frequencies to logarithmically spaced frequencies in a measuring apparatus. A spectrum within a predetermined frequency range from logarithmically spaced frequencies is selected from this spectrum corresponding to linearly spaced frequencies and vector averaging of the selected spectrum is performed.

4 Claims, 11 Drawing Sheets

METHOD OF MAPPING LINEARLY SPACED SPECTRUM POINTS TO LOGARITHMICALLY SPACED FREQUENCY AND A MEASURING APPARATUS USING THE METHOD

FIELD OF THE INVENTION

The present invention relates to a spectrum processing method whereby a spectrum obtained from signals under test and corresponding to linearly spaced frequencies is mapped to logarithmically spaced frequencies by a measuring apparatus. Moreover, the present invention pertains to a measuring apparatus that uses this method.

DISCUSSION OF THE BACKGROUND ART

Conventional phase noise measuring apparatuses have a source of phase noise inside them; therefore, there are limits to the precision of their phase noise measurement. In order to alleviate the effect of this internal phase noise on measurement results, conventional phase noise measuring apparatuses are made from components with low phase noise properties. In addition, the phase noise that is generated inside the phase noise measuring apparatus is pre-determined as an error component and the measurement results are corrected using this error component (refer to JP unexamined Patent Publication (Kokai) No. 2003-287,555 (page 2, FIG. 4, FIG. 5), for instance).

However, there are several problems with the above-mentioned phase noise measuring apparatuses. First, conventional phase noise measuring apparatuses cannot achieve the desired phase noise properties. The lowest noise level that must be measured by phase noise measurement has been decreasing for years. For instance, today the phase noise property must be 135 dBc/Hz (for 10 KHz offset and 1 GHz carrier). However, when a phase noise measuring apparatus is made from components having a low phase noise property, there are limits to the extent to which performance of the phase noise measuring apparatus can be improved because these components do generate some noise. Even if measurement results are corrected using the predetermined phase noise correction component, it is not possible to completely eliminate the phase noise that is generated inside the phase noise measuring apparatus.

In addition, if any type of processing has been performed on the signals under test before the phase noise is measured by a conventional phase noise measuring apparatus, it will not be possible to eliminate from the measurement results the effect of the phase noise generated by this signal processing. For instance, when a down converter is added in front of the phase noise measuring apparatus in order to expand the measurement frequency range, the phase noise measuring apparatus will measure the phase noise from the down converter as well as the phase noise of the signal under test. The same can be said when an amplifier is added in front of the phase noise measuring apparatus in order to improve sensitivity. This is also true when these additional devices and additional circuits are placed upstream of a phase noise detector inside a phase noise measuring apparatus. It is often difficult to predetermine the phase noise generated by these additional devices and circuits. Consequently, these additional devices and circuits must be made from components having low phase noise properties in order to reduce the effect of the additional devices and circuits on the measurement results.

Conventional countermeasures for reducing phase noise will now be discussed. That is, expensive components having low noise properties are used in order to lower the noise of each part of an apparatus; a PLL is multiplied in order to disperse the effect of the PLL on noise and to reduce noise; multiple substitutions are made in order to assemble the optimal apparatus structure in accordance with frequency; and the like. These countermeasures all increase production cost and have the opposite effect of the desired reduction in production cost. Furthermore, even if the above-mentioned measures are used, there is a demand for such low phase noise properties that they are impossible to realize, and even if production costs rise, it is not possible to lower the noise to the extent necessary.

The present invention solves the above-mentioned problems, an object thereof being to provide a method and an apparatus for measuring phase noise that is lower than could be measured in the past. Moreover, another object of the present invention is to provide a method and an apparatus with which phase noise that is lower than could be measured in the past can now be measured for signals over a relatively broad frequency range.

SUMMARY OF THE INVENTION

A method for measuring the phase noise of signals under test, characterized in that it comprises: a step for generating first phase signals that represent the phase of these signals under test; a step for generating second phase signals that represent the phase of these signals under test; a step for finding at least a specific number of cross spectra between these first phase signals and these second phase signals; and a step for finding the average for this specific number of these cross spectra.

Another embodiment includes a method for measuring the phase noise of signals under test, characterized in that it comprises: a step for generating first intermediate signals from these signals under test using a first signal processing means; a step for generating second intermediate signals from these signals under test using a second signal processing means separate from this first signal processing means; a step for generating first phase signals that represent the phase of these first intermediate signals; a step for generating second phase signals that represent the phase of these second intermediate signals; a step for finding at least a specific number of cross spectra of these first phase signals and these second phase signals; and a step for finding the average for this specific number of these cross spectra.

Still yet another embodiment of the present invention is a method for measuring the phase noise of signals under test, characterized in that it comprises: a step for generating first phase signals that represent the phase of signals under test using first local signals generated in reference to first standard signals; a step for generating second phase signals that represent the phase of these signals under test using second local signals generated while referring to second standard signals having a frequency different from these first standard signals; and a step for finding the cross spectra between these first phase signals and these second phase signals.

The present invention also encompasses an apparatus for measuring the phase noise of signals under test by any of the methods discussed above.

A further embodiment of the present invention is an apparatus for measuring the phase noise of signals under test by correlating or by cross-spectrum processing of at least two phase signals obtained from the signals under test, this apparatus characterized in that it comprises a distributor for distributing these signals under test in at least two parts; a first phase detection means; a second phase detection means; a first pair of terminals for opening a connecting path between this distributor and this first phase detection means; and a second pair of terminals for opening a connecting path between this distributor and this second phase detection means, and in that this first pair of terminals and this second pair of terminals are either both short-circuited or both connected to different outside signal processing means.

Furthermore, an additional embodiment of the present invention is an apparatus for measuring the phase noise of signals under test, this apparatus characterized in that it comprises a first phase detection means for detecting the phase of first distributed signals distributed from these signals under test, a second phase detection means separate from the first phase detection means for detecting the phase of second distributed signals distributed from these signals under test, and a plurality of cross-spectrum generation means responsible for different frequency bands; these cross-spectrum generation means find the cross spectrum between the output signals of the first phase detection means and the output signals of the second phase detection means at the respective frequency bands for which they are responsible; and each of these cross-spectrum generation means repeatedly finds the cross spectrum between the output signals of this first phase detection means and the output signals of this second phase detection means within the same time, and when two or more of these cross spectra have been found within this time, vector averaging in terms of time is performed on these two or more resulting cross spectra.

The present invention also includes a spectrum processing method whereby a spectrum obtained from signals under test and corresponding to linearly spaced frequencies is mapped to logarithmically spaced frequencies by a measuring apparatus, this method characterized in having a step for performing vector averaging on this spectrum selected from these spectra corresponding to linearly spaced frequencies. The present invention also includes a measuring apparatus, characterized in that a spectrum corresponding to logarithmically spaced frequencies is generated by the method immediately above.

DETAILED DESCRIPTION OF THE PREFERRED EMBODIMENT

The details of the present invention will be clarified by the following description. By means of the present invention, phase noise is measured by correlating or cross-spectrum processing; therefore, it is possible to measure phase noise of a lower level than in the past.

Moreover, by means of the present invention, averaging in terms of frequency is performed on a cross spectrum; therefore, phase noise of a lower level can be measured.

By means of the present invention, the above-mentioned correlating or cross-spectrum processing is performed in a plurality of processing blocks; therefore, the number of times processing is performed per unit of time can be increased for each processing block and it is possible to measure phase noise of a lower level than when correlating or cross-spectrum processing is only performed once.

By means of the present invention, when phase noise is measured using correlating or cross-spectrum processing, the frequencies of the standard signal sources among the signal sources that participate in the measurements are different; therefore, it is possible to reduce the spurious effect of this signal source on the values measured for phase noise.

By means of the present invention, when phase noise is measured using correlating or cross spectrum processing, the signals under test are distributed and each of the distributed signals under test are processed by a different signal processing means; therefore, the effect of this signal processing means on the measured value for phase noise can be reduced. The effect of the present invention is obvious when, for instance, the signal processing means is a frequency conversion means having a signal source.

Figure 1:
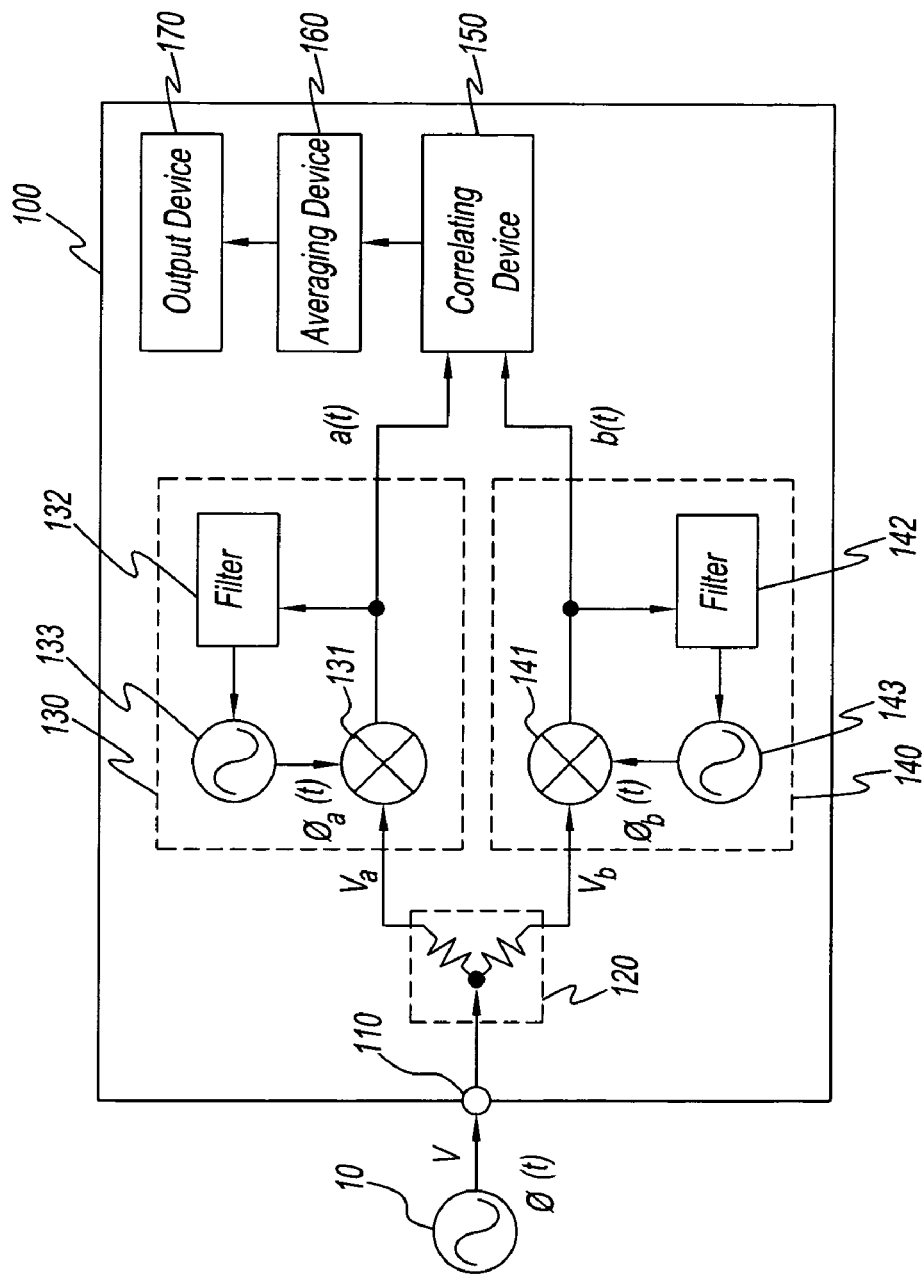
FIG. 1 is a block diagram showing the structure of the first embodiment of the present invention, phase noise measuring apparatus 100.

Preferred embodiments of the present invention will now be described while referring to the attached drawings as needed. The first embodiment of the present invention is a phase noise measuring apparatus 100. A block diagram showing the structure of phase noise measuring apparatus 100 is shown in FIG. 1. A device under test 10 and phase noise measuring apparatus 100 are shown in FIG. 1.

Device under test 10 outputs V signals under test, which are the object of phase noise measurement. Device under test 10 is a signal source or a component, apparatus, or system to which signals are applied.

Phase noise measurement apparatus 100 is constructed as described below. That is, phase noise measurement apparatus 100 consists of an input terminal 110, a distributor 120, a PLL block 130, which is an example of a phase detection means, a PLL block 140, which is an example of a phase detection means, a correlating device 150; an averaging device 160, and an output device 170. Input terminal 110 is a terminal for receiving V signals under test. Distributor 120 is a device that distributes V signals under test that have been received at input terminal 110 and outputs them to PLL block 130 and PLL block 140. PLL block 130 is a device that detects the phase of signals $V_a$ distributed from distributor 120. PLL block 130 consists of a mixer 131, a filter 132, and a signal source 133. Distributed signals $V_a$ and the output signals of signal source 133 are input to mixer 131 and the mixer outputs the phase difference between these signals. Filter 132 is a loop filter that restricts the bandwidth of the PLL. Signal source 133 is a signal source that controls the frequency and phase of the output signals in accordance with the output signals of filter 132. PLL block 140 is a device that detects the phase of signals $V_b$ distributed from distributor 120. PLL block 140 has a mixer 141, a filter 142, and a signal source 143. Distributed signals $V_b$ and the output signals from signal source 143 are input to mixer 141, which outputs the phase difference between these signals. Filter 142 is a loop filter that restricts PLL bandwidth. Signal source 143 is a signal source that controls the frequency and phase of the output signals in accordance with the output signals of filter 142. Correlating device 150 is a device that finds the cross spectrum between phase signals a(t), which are the output signals of PLL block 130, and phase signals b(t), which are the output signals of PLL block 140. Correlating device 150 will be described in detail while referring to FIG. 2.

Figure 2:
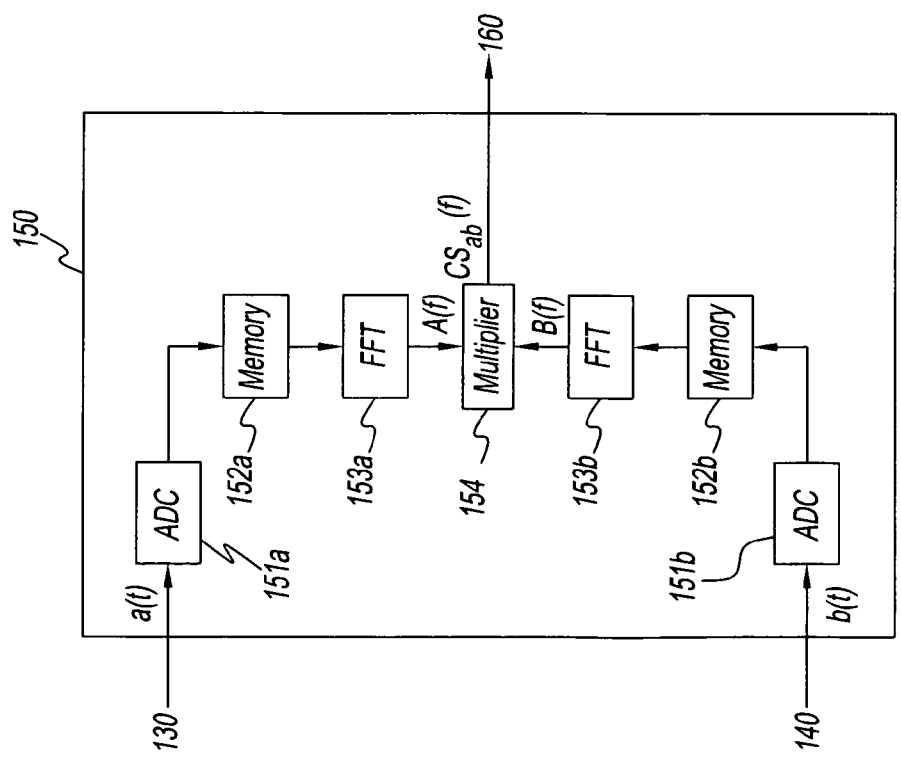
FIG. 2 is a block diagram showing the structure of correlating device 150.

FIG. 2 is a block diagram showing the structure of correlating device 150. Correlating device 150 in FIG. 2 has an analog-digital converter 151a, a memory 152a, a fast Fourier transform device 153a, which is an example of a spectrum analyzing means, and a multiplier 154. Hereafter, the analog-digital converter is referred to as the ADC and the fast Fourier transform device is referred to as the FFT. FFT is also used as an abbreviation for performing fast Fourier transform. ADC 151a is a device that performs analog-digital conversion of phase signals a(t). Memory 152a is a device that stores the digitized phase signals a(t), which are the results of conversion by ADC 151a. FFT 153a performs Fourier transforms of phase signals a(t) stored in memory 152a. Moreover, component A(f) with a Nyquist frequency of (fs/2) or less is output to multiplier 154 from the results of Fourier transforms of phase signals a(t). ADC 151b is the device that performs analog-digital conversion of phase signals b(t). It should be noted that ADC 151a and ADC 151b have the same conversion processing speed fs (samples/second). Memory 152b is the device that stores digitized phase signals b(t), which are the result of conversion by ADC 151b. FFT 153b performs Fourier transforms of phase signals b(t) stored in memory 152b. Moreover, component B(f) with a Nyquist frequency of fs/2 or less is output to multiplier 154 from the results of Fourier transform of phase signals b(t). FFT 153a and FFT 153b have the same number of points. Multiplier 154 performs the processing represented by the following formula on the Fourier transform result A(f) and the Fourier transform result B(f).

[Mathematical formula 1]

$$S_{ab}(f) = A(f)B(f)^* \quad (1)$$

$S_{ab}(f)$ is the cross spectrum between a(t) and b(t). An asterisk (*) indicates complex conjugation.

$S_{ab}(f)$, which is the processing result of multiplier 154, is output to averaging device 160.

Refer to FIG. 1 again. Averaging device 160 performs the averaging, represented by the following formula, on the processing results $S_{ab}(f)$.

[Mathematical formula 2]

$$AS_{ab}(f) = \frac{1}{N}\sum_{k=1}^{N} S_{ab}(k, f) \quad (2)$$

N is an integer of 1 or higher. $S_{ab}(k,f)$ is cross spectrum $S_{ab}(f)$ obtained after k number of iterations. As previously noted, averaging a plurality of complex numbers as real number parts and imaginary parts separately is called "vector averaging" in the present Specification. In contrast to this, averaging the amplitude (absolute number) or the power (square of the absolute number) of a plurality of complex numbers is called "scalar averaging." The "average" or "averaging" function in general measuring apparatuses uses scalar averaging.

Output device 170 is a liquid crystal display or other device that displays the processing result $AS_{ab}(f)$ of averaging device 160 (not illustrated), a printer or other printing device that displays the results (not illustrated), or a device that outputs the results to a LAN interface or other communications device (not illustrated).

The theory behind phase noise measurement using cross-correlating or cross-spectrum processing is described below. First, the phase of V signals under test is $\phi(t)$, the phase of the output signals of signal source 133 is $\phi_a(t)$, and the phase of the output signals of signal source 143 is $\phi_b(t)$. Phase signals a(t) and b(t) at this time are represented by the following formulas.

[Mathematical formula 3]

$$a(t) \propto [\phi(t) - \phi_a(t)] \quad (3)$$

[Mathematical formula 4]

$$b(t) \propto [\phi(t) - \phi_b(t)] \quad (4)$$

Moreover, correlation $C_{ab}(\tau)$ between phase signals a(t) and b(t) is represented by the following formula.

[Mathematical formula 5]

$$C_{ab}(\tau) = \lim_{T\to\infty}\frac{1}{T}\int_0^T a(t)b(t-\tau)dt \quad (5)$$

The cross spectrum $S_{ab}(f)$ of phase signals a(t) and b(t) is obtained by Fourier transform of correlation $C_{ab}(\tau)$ represented by formula (5). The one-sided spectrum of cross spectrum $S_{ab}(f)$ is represented by the following formula.

[Mathematical formula 6]

$$S_{ab}(f) = 2\int_{-\infty}^{\infty} C_{ab}(\tau)e^{-j2\pi f\tau}d\tau \, (f>0) \quad (6)$$

[Mathematical formula 7]

$$S_{ab}(f) = 0 \, (f<0) \quad (7)$$

The following formulas are obtained assuming that phase $\phi(t)$ of V signals under test, phase $\phi_a(t)$ of the output signals of signal source 133, and phase $\phi_b(t)$ of the output signals of signal source 143 are each independent.

[Mathematical formula 8]

$$C_{ab}(\tau) \propto [C_{\phi\phi}(\tau)+C_{\phi_a\phi_b}(\tau)-C_{\phi\phi_a}(\tau)-C_{\phi\phi_b}(\tau)] \quad (8)$$

[Mathematical formula 9]

$$S_{ab}(f) \propto [S_\phi(f)+S_{\phi_a\phi_b}(f)-S_{\phi\phi_a}(f)-S_{\phi\phi_b}(f)] \quad (9)$$

$C_{\phi\phi}(t)$ is the auto-correlation of $\phi(t)$. $C_{\phi_a\phi_b}(t)$ is the cross-correlation between $\phi_a(t)$ and $\phi_b(t)$. $C_{\phi\phi_a}(t)$ is the cross-correlation between $\phi(t)$ and $\phi_a(t)$. $C_{\phi\phi_b}(t)$ is the cross-correlation between $\phi(t)$ and $\phi_b(t)$.

In addition, $S_\phi(f)$ is the spectrum of $\phi(t)$. $S_{\phi_a\phi_b}(f)$ is the cross spectrum between $\phi_a(t)$ and $\phi_b(t)$. $S_{\phi\phi_a}(f)$ is the cross spectrum between $\phi(t)$ and $\phi_a(t)$. $S_{\phi\phi_b}(t)$ is the cross spectrum between $\phi(t)$ and $\phi_b(t)$.

The cross-correlation components in formulas (8) and (9) approach zero as the above-mentioned integration time T increases and formulas (8) and (9) can be represented as follows.

[Mathematical formula 10]

$$C_{ab}(\tau) \propto C_{\phi\phi}(\tau) \quad (10)$$

[Mathematical formula 11]

$$S_{ab}(f) \propto S_\phi(f) \quad (11)$$

There are often cases wherein in real-time correlation processing that is integrated over a long time becomes difficult, or additional resources become necessary. By means of the present invention, equivalent processing of long-term integrated correlation is provided by finding two or more cross spectra between phase signals a(t) and phase signals b(t) during a limited time and then vector averaging the resulting two or more cross spectra in order to simplify the device structure. In other words, cross-correlated phase noise is obtained by converting the cross spectra that are eventually obtained to a time domain.

Moreover, the theoretical basis for this is established when the loop bandwidth of the PLL which is or the phase detection means, is regarded as zero. The loop bandwidth of PLL block 130 or PLL block 140 actually is not zero. Consequently, in the phase signals extracted by the PLL, components within the loop band of the PLL are suppressed. For instance, when the open loop gain of PLL block 130 and PLL loop 140 is 10 dB, the component of phase signal a(t) and phase signal b(t) within the loop band of PLL block 130 and PLL block 140 is 10 dB smaller than the original value. In order to solve this problem, phase noise measuring apparatus 100, and the phase noise measuring apparatus of another embodiment discussed later in this patent document, are such that they compensate for the component of the spectrum that is eventually obtained and is within the loop band of the PLL.

Phase noise measuring apparatus 100 structured as described above operates as follows. First, PLL block 130 is phase locked with respect to distributed signals $V_a$. Moreover, PLL block 140 is phase locked with respect to distributed signals $V_b$. Thus, phase signals a(t), which are the phase noise component of signals V under test are output from PLL block 130. Moreover, phase signals b(t), which are the phase noise component of signals V under test, are output from PLL block 140. Correlating device 150 finds a specific number only of cross spectra between phase signals a(t) and phase signals b(t). Averaging device 160 vector averages one or more cross spectra obtained from correlating device 150. Phase noise component $\phi_a(t)$ generated by signal source 133 and phase noise component $\phi_b(t)$ generated by signal source 143 can approach zero as the number of cross spectra that are the subject of averaging increases at this time. As described above, the averaging of a plurality of spectra obtained at different times is called averaging in terms of time in the present Specification. On the other hand, averaging of a plurality of components with different corresponding frequencies in the same spectrum is called averaging in terms of frequency in the present Specification.

Thus, the above-mentioned cross spectrum corresponds to linearly spaced frequencies. However, at least the frequency axis is generally represented on a log scale when the results of phase noise measurement are output. Therefore, averaging device 160 maps the cross spectrum corresponding to linearly spaced frequencies to logarithmically spaced frequencies using vector averaging in terms of frequency. An example of this procedure is described below.

First, the ADC conversion speed is 250 k samples/second. Moreover, the number of FFT points is 128. The FFT points at this time are as shown in Table 1. Only the points of Nyquist frequency or lower are represented with the corresponding frequency in Table 1.

TABLE 1

| FFT points | |
|---|---|
| Count | Frequency (Hz) |
| 0 | 0 |
| 1 | 1,953 |
| 2 | 3,906 |
| 3 | 5,859 |
| 4 | 7,813 |
| 5 | 9,766 |
| 6 | 11,719 |
| 7 | 13,672 |
| 8 | 15,625 |
| 9 | 17,578 |
| 10 | 19,531 |
| 11 | 21,484 |
| 12 | 23,438 |
| 13 | 25,391 |
| 14 | 27,344 |
| 15 | 29,297 |
| 16 | 31,250 |
| 17 | 33,203 |
| 18 | 35,156 |
| 19 | 37,109 |
| 20 | 39,063 |
| 21 | 41,016 |
| 22 | 42,969 |
| 23 | 44,922 |
| 24 | 46,875 |
| 25 | 48,828 |
| 26 | 50,781 |
| 27 | 52,734 |
| 28 | 54,688 |
| 29 | 56,641 |
| 30 | 58,594 |
| 31 | 60,547 |
| 32 | 62,500 |
| 33 | 64,453 |
| 34 | 66,406 |
| 35 | 68,359 |
| 36 | 70,313 |
| 37 | 72,266 |
| 38 | 74,219 |
| 39 | 76,172 |
| 40 | 78,125 |
| 41 | 80,078 |
| 42 | 82,031 |
| 43 | 83,984 |
| 44 | 85,938 |
| 45 | 87,891 |
| 46 | 89,844 |
| 47 | 91,797 |
| 48 | 93,750 |
| 49 | 95,703 |
| 50 | 97,656 |
| 51 | 99,609 |
| 52 | 101,563 |
| 53 | 103,516 |

TABLE 1-continued

FFT points

| Count | Frequency (Hz) |
|---|---|
| 54 | 105,469 |
| 55 | 107,422 |
| 56 | 109,375 |
| 57 | 111,328 |
| 58 | 113,281 |
| 59 | 115,234 |
| 60 | 117,188 |
| 61 | 119,141 |
| 62 | 121,094 |
| 63 | 123,047 |
| 64 | 125,000 |

The cross spectrum corresponding to the linearly spaced frequencies shown in Table 1 corresponds to the logarithmically spaced frequencies shown in Table 2. The cross spectrum is represented by the logarithmically spaced 21 frequency points between 1 kHz and 100 kHz.

TABLE 2

| Displayed point | | | FFT count | |
|---|---|---|---|---|
| Count | Frequency (Hz) | Boundary frequency (Hz) | Start point | End point |
| | | 891 | | |
| 0 | 1,000 | | 1 | 1 |
| | | 1,122 | | |
| 1 | 1,259 | | 1 | 1 |
| | | 1,413 | | |
| 2 | 1,585 | | 1 | 1 |
| | | 1,778 | | |
| 3 | 1,995 | | 1 | 1 |
| | | 2,239 | | |
| 4 | 2,512 | | 2 | 2 |
| | | 2,818 | | |
| 5 | 3,162 | | 2 | 2 |
| | | 3,548 | | |
| 6 | 3,981 | | 2 | 2 |
| | | 4,467 | | |
| 7 | 5,012 | | 2 | 2 |
| | | 5,623 | | |
| 8 | 6,310 | | 3 | 3 |
| | | 7,079 | | |
| 9 | 7,943 | | 4 | 4 |
| | | 8,913 | | |
| 10 | 10,000 | | 5 | 5 |
| | | 11,220 | | |
| 11 | 12,589 | | 6 | 7 |
| | | 14,125 | | |
| 12 | 15,849 | | 8 | 9 |
| | | 17,783 | | |
| 13 | 19,953 | | 10 | 11 |
| | | 22,387 | | |
| 14 | 25,119 | | 12 | 14 |
| | | 28,184 | | |
| 15 | 31,623 | | 15 | 18 |
| | | 35,481 | | |
| 16 | 39,811 | | 19 | 22 |
| | | 44,668 | | |
| 17 | 50,119 | | 23 | 28 |
| | | 56,234 | | |
| 18 | 63,096 | | 29 | 36 |
| | | 70,795 | | |
| 19 | 79,433 | | 37 | 45 |
| | | 89,125 | | |
| 20 | 100,000 (Hz) | | 46 | 57 |
| | | 112,202 (Hz) | | |

The frequencies that correspond to the display points are shown in Table 2. The frequencies corresponding to the middle point between adjacent display points are shown as the boundary frequencies. By means of this procedure, a linearly spaced frequency point that is between these boundary frequencies is selected while referring to the boundary frequencies on either side of each display point. Vector averaging is performed on the cross spectra corresponding to the selected frequency points. The results of vector averaging eventually become the cross spectrum of logarithmically spaced display points.

For instance, the cross spectrum of display points of count 14 is obtained as described below. First, the boundary frequencies on either side of the display point of count 14 are referenced. These frequencies are 22,387 Hz and 28,184 Hz. Next, the FFT points included between these two frequencies are found from Table 1. FFT points from count 12 to count 14 are found. Next, vector averaging of the cross spectrum at the three FFT points that were found is performed. One cross spectrum obtained by averaging is the cross spectrum of the display point of count 14. Next, the boundary frequencies on either side of the display point of count 4 are 2239 Hz and 2818 Hz. However, the FFT points that are included between these two frequencies cannot be found from Table 1. In such a case, the boundary frequency on the high-frequency side is increased by one each time. Thus, the FFT point of count 2 is found when the boundary frequency on the high-frequency side is 4467 Hz. When there is one FFT point, the original value and averaged value will be the same. Consequently, the cross spectrum at the FFT point of count 2 becomes the untouched cross spectrum of the display point of count 4. The corresponding start point and end point of the FFT point found by above way are shown in Table 2.

In addition, when the number of points of FFT is 1024, the start point and the end point of the related FFT points is as shown in Table 3.

TABLE 3

| Displayed point | | | FFT count | |
|---|---|---|---|---|
| Count | Frequency (Hz) | Boundary frequency (Hz) | Start point | End point |
| | | 891 | | |
| 0 | 1,000 | | 4 | 4 |
| | | 1,122 | | |
| 1 | 1,259 | | 5 | 5 |
| | | 1,412 | | |
| 2 | 1,585 | | 6 | 7 |
| | | 1,778 | | |
| 3 | 1,995 | | 8 | 9 |
| | | 2,239 | | |
| 4 | 2,512 | | 10 | 11 |
| | | 2,818 | | |
| 5 | 3,162 | | 12 | 14 |
| | | 3,548 | | |
| 6 | 3,981 | | 15 | 18 |
| | | 4,467 | | |
| 7 | 5,012 | | 19 | 23 |
| | | 5,623 | | |
| 8 | 6,310 | | 24 | 28 |
| | | 7,079 | | |
| 9 | 7,943 | | 29 | 36 |
| | | 8,913 | | |
| 10 | 10,000 | | 37 | 45 |
| | | 11,220 | | |
| 11 | 12,589 | | 46 | 57 |
| | | 14,125 | | |
| 12 | 15,849 | | 58 | 72 |
| | | 17,783 | | |

TABLE 3-continued

| Displayed point | | | FFT count | |
|---|---|---|---|---|
| Count | Frequency (Hz) | Boundary frequency (Hz) | Start point | End point |
| 13 | 19,953 | | 73 | 91 |
| | | 22,387 | | |
| 14 | 25,119 | | 92 | 115 |
| | | 28,184 | | |
| 15 | 31,623 | | 116 | 145 |
| | | 35,481 | | |
| 16 | 39,811 | | 146 | 182 |
| | | 44,668 | | |
| 17 | 50,119 | | 183 | 230 |
| | | 56,234 | | |
| 18 | 63,096 | | 231 | 289 |
| | | 70,795 | | |
| 19 | 79,433 | | 290 | 365 |
| | | 89,125 | | |
| 20 | 100,000 (Hz) | | 366 | 459 |
| | | 112,202 (Hz) | | |

When two or more FFT points have been found, vector averaging is performed in terms of frequency. Phase noise component $\phi_a(t)$ generated by signal source 133 and phase noise component $\phi_b(t)$ generated by signal source 143 come even closer to zero with an increase in the number of averaging objects.

Figure 3:
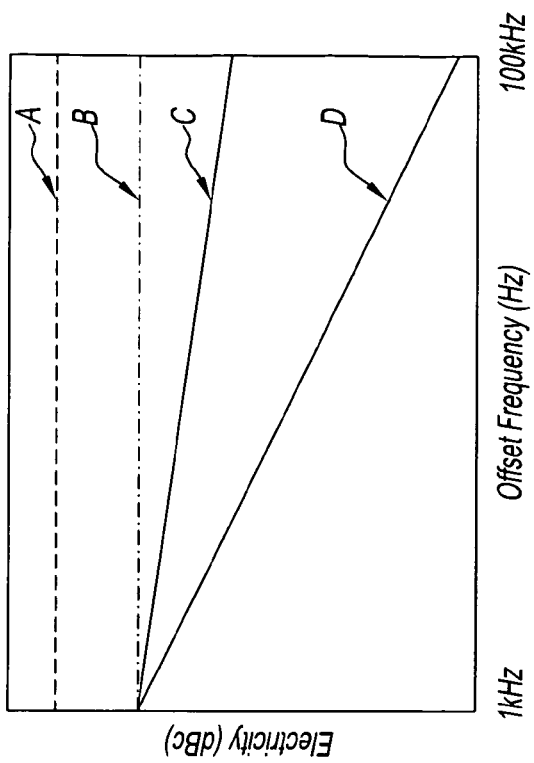
FIG. 3 is a drawing of the averaging results.

Therefore, a graph representing the results of averaging is shown in FIG. 3. FIG. 3 is the cross spectrum when ideal V signals under test which are completely free of phase noise are input to phase noise measuring apparatus 100 displayed on a log-log graph. The y-axis of the graph in FIG. 3 is power and the x-axis is offset frequency. The curves in FIG. 3 are the so-called noise floor. Curve A is the cross spectrum when only one cross spectrum is found and the above-mentioned vector averaging in terms of frequency is not performed. It should be noted that the real curve A is a curve that drops off gently with an increase in frequency. However, in the present Specification it is assumed that curve A is a horizontal line in order to simplify the description. Moreover, curves B and C and D represent the difference from curve A. Curve B is the cross spectrum when the cross spectrum is found a plurality of times and vector averaging in terms of time is performed on the resulting plurality of cross spectra. It should be noted that the above-mentioned vector averaging in terms of frequency is not performed on curve B. Curves C and D represent the cross spectrum when the cross spectrum is found a plurality of times; vector averaging in terms of time, and further, vector averaging in terms of frequency, are performed on the resulting plurality of cross spectra. Curve C is related to Table 2. Curve D is related to Table 3. As is clear from FIG. 3, the internal noise decreases with an increase in the number of averaging objects.

The vector average in terms of frequency described above can be performed before or after averaging in terms of time is performed by averaging device 160.

By means of the method that was illustrated above, a spectrum that falls within a predetermined frequency range from logarithmically spaced frequencies is selected from spectra corresponding to linearly spaced frequencies and vector averaging is performed on the selected spectrum. The method whereby vector averaging in terms of frequency is performed on a spectrum that corresponds to linearly spaced frequencies while the number of averaging objects increases logarithmically with an increase in frequency is another method for mapping a cross spectrum corresponding to linearly spaced frequencies to logarithmically spaced frequencies. There are cases wherein it is difficult to arrange frequencies points with perfect regular spacing because of insufficient calculation precision, and the like. In this case, the frequency points can also be arranged with approximately regular spacing.

In the end, the processing results of averaging device 160 are output to output device 170. For instance, the averaged cross spectrum is displayed as a graph on a liquid crystal display (not illustrated) as the result of phase noise measurement. dBc/Hz is generally used as the unit for phase noise measurement; therefore, what is often used is the cross spectrum that is obtained by dividing the resulting spectrum by the equivalent noise bandwidth and normalizing the product for 1 Hz. Furthermore, the result of correcting the frequency properties of the receiving system as needed are also output.

Figure 4:
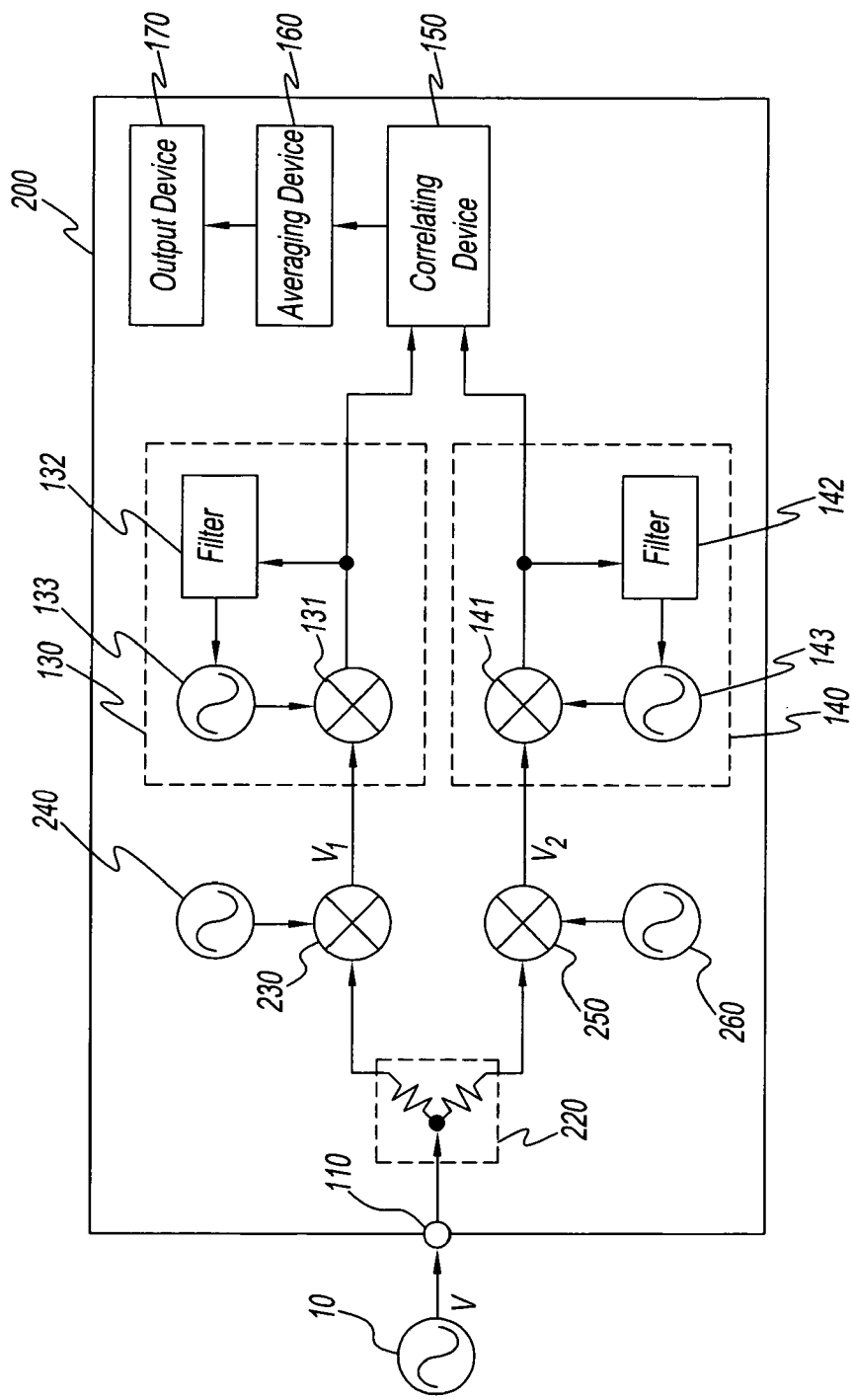
FIG. 4 is a block diagram showing the structure of the second embodiment of the present invention, phase noise measuring apparatus 200.

Next, a phase noise measuring apparatus 200 capable of measuring the phase noise of signals V under test having a broader frequency range will be described as the second embodiment of the present invention. A block diagram showing the structure of the second embodiment of the present invention, phase noise measuring apparatus 200, is shown in FIG. 4. The same reference symbols are used for the same structural elements as in FIG. 1 and a description thereof is omitted.

Phase noise measuring apparatus 200 in FIG. 4 has, in addition to phase noise measuring apparatus 100, a mixer 230, a signal source 240, a mixer 250, and a signal source 260. Moreover, phase noise measuring apparatus 200 has a distributor 220 in place of distributor 120. Distributor 220 is a distributor with a broader bandwidth than distributor 120. The frequency of the output signals of signal sources 240 and 260 is variable. The set made up of mixer 230 and signal source 240 and the set made up of mixer 250 and signal source 260 make up respective frequency conversion devices. When the frequency of the output signals of signal source 240 and the frequency of the output signals of signal source 260 are different, intermediate signal $V_1$, which is the output signal of mixer 230, and an intermediate signal $V_2$, which is the output signal of mixer 250, will have different frequencies. In this case, signal source 133 and signal source 143 are set at different frequencies. The frequencies of the output signals of signal source 240 and signal source 260 can be fixed. However, in this case the measurement frequency range is restricted.

When frequency conversion is performed in accordance with conventional methods, signals V under test are frequency converted before distributor 220. However, by means of the present invention, frequency conversion is performed with separate devices after distributor 220. Thus, as long as there is a separate signal processing means in each path between the distributor and the phase detection means when signals under test are processed before the phase detection means, the effect of a phase noise component generated by these signal processing means on the phase noise measurement results for the signals under test can be reduced. That is, the phase noise component that is produced by mixer 230, signal source 240, mixer 250, and signal source 260 is processed as a cross-correlation component at correlating device 150 that comes later; therefore, the effect on the results of measuring phase noise of signals V under test can be reduced.

Figure 5:
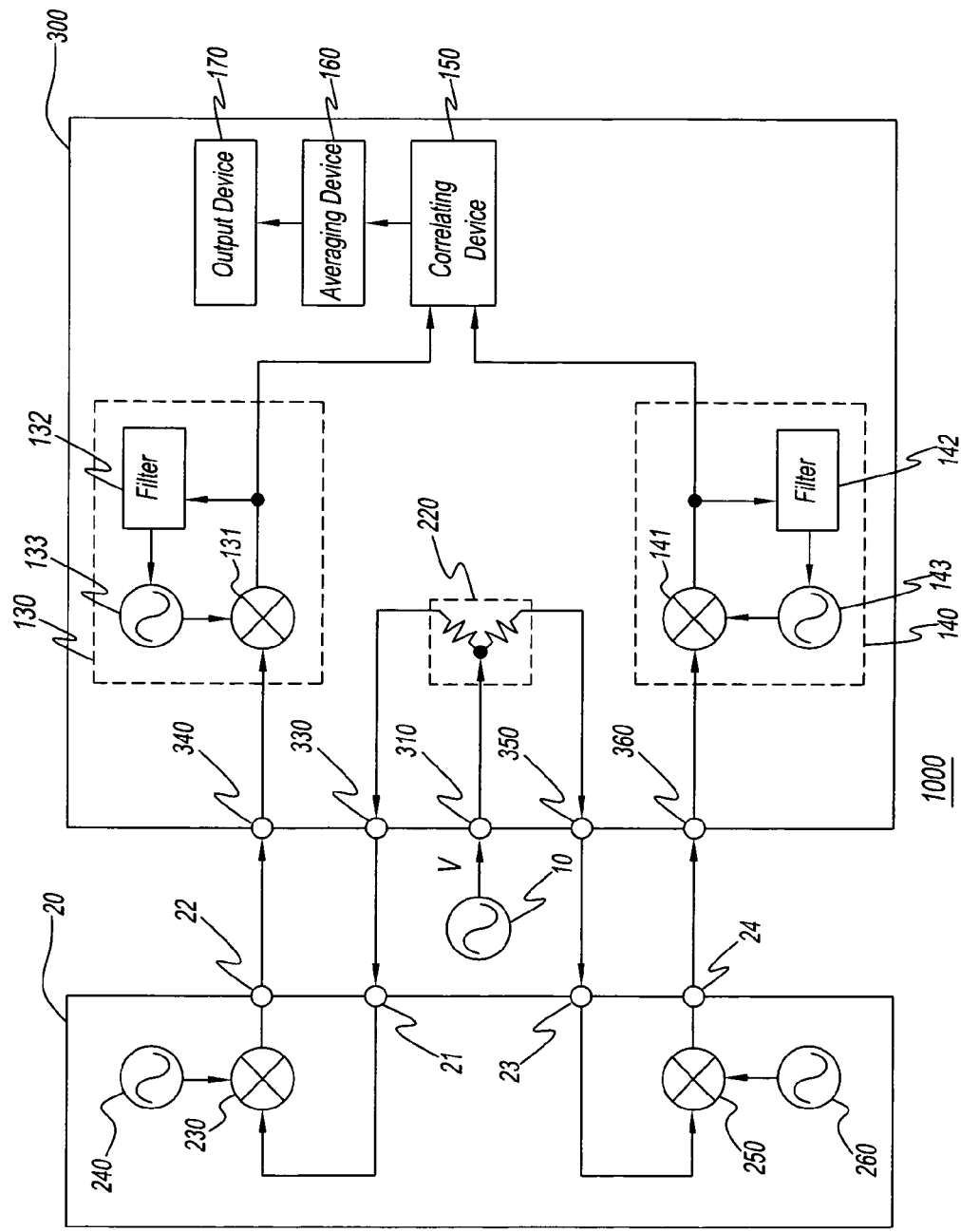
FIG. 5 is a block diagram showing the structure of the third embodiment of the present invention, phase noise measuring apparatus 1000.

Next, the phase noise measuring system capable of measuring the phase noise of signals V under test from a broader frequency range will be described as a third embodiment of the present invention. A block diagram showing the structure of the third embodiment of the present invention, a phase noise measuring system 1000, is shown in FIG. 5. The same reference symbols are used for the same structural elements as in FIG. 4 and a description thereof is omitted. Refer to FIG. 5 hereafter. Phase noise measuring system 1000 has a phase noise measuring apparatus 300 and a frequency conversion box 20.

Phase noise measuring apparatus 300 is phase noise measuring apparatus 200 from which mixer 230, signal source 240, mixer 250, and signal source 260 have been removed and to which input terminals 310, 340, and 360 as well as output terminals 330 and 350 have been added. Input terminal 310 is the terminal for receiving signals V under test and feeding the received signals to distributor 220. Output terminals 330 and 350 are connected to distributor 220. Distributor 220 distributes the signals V under test received at input terminal 310, outputting these signals to output terminals 330 and 350, respectively. Input terminal 340 is the terminal for receiving intermediate signals $V_1$ and this terminal feeds the received signals to PLL block 130. Input terminal 360 is the terminal for receiving intermediate signals $V_2$ and this terminal feeds the received signals to PLL block 140. Intermediate signals $V_1$ are signals distributed from signals V under test by distributor 220, or signals that have been further frequency converted by mixer 230 and signal source 240 after distribution. In addition, intermediate signals $V_2$ are signals distributed from signals V under test by distributor 120 or signals that have been further frequency converted by mixer 250 and signal source 260 after distribution.

Frequency conversion box 20 has input terminals 21 and 23, output terminals 22 and 24, signal sources 240 and 260, and mixers 230 and 250. Input terminal 21 is connected to output terminal 330. Moreover, input terminal 23 is connected to output terminal 350. Output terminal 22 is connected to input terminal 340. Output terminal 24 is further connected to input terminal 360. The signals received by input terminal 21 of frequency conversion box 20 are frequency converted by mixer 230 to which signal source 240 is connected and output by output terminal 22. The signals received by input terminal 23 are frequency converted by mixer 250 to which signal source 260 has been connected and output by output terminal 24. It should be noted that frequency conversion box 20 has a connector terminal (not illustrated) for receiving control information from phase noise measuring apparatus 300 or a PC or another external control device. Moreover, the frequency of the output signals of signal source 240 and signal source 260 are controlled by phase noise measuring apparatus 300.

As previously described, the connection path between distributor 220 and PLL block 130 is open to a test operator by the pair of output terminal 330 and input terminal 340. Moreover, the connection path between distributor 220 and PLL block 140 is open to a test operator by the pair of output terminal 350 and input terminal 360. When frequency conversion is not necessary, the circuit between output terminal 330 and input terminal 340, and the circuit between output terminal 350 and input terminal 360 should be short-circuited. When frequency conversion is necessary, output terminal 330 should be connected to input terminal 21, output terminal 22 should be connected to input terminal 340, output terminal 350 should be connected to input terminal 23, and output terminal 24 should be connected to input terminal 360. As with phase noise measuring apparatus 200, phase noise measuring system 1000 has separate signal processing means in the path between the distributor and the phase detection means; therefore, it is possible to reduce the effect of the phase noise component produced by these signal processing means on the results of phase noise measurement of the signals under test. Moreover, phase noise measuring system 1000 can selectively perform frequency conversion. Phase noise measuring apparatus 300 received V signals under test; therefore, it can easily house a device that measures other parameters of V signals under test.

Figure 6:
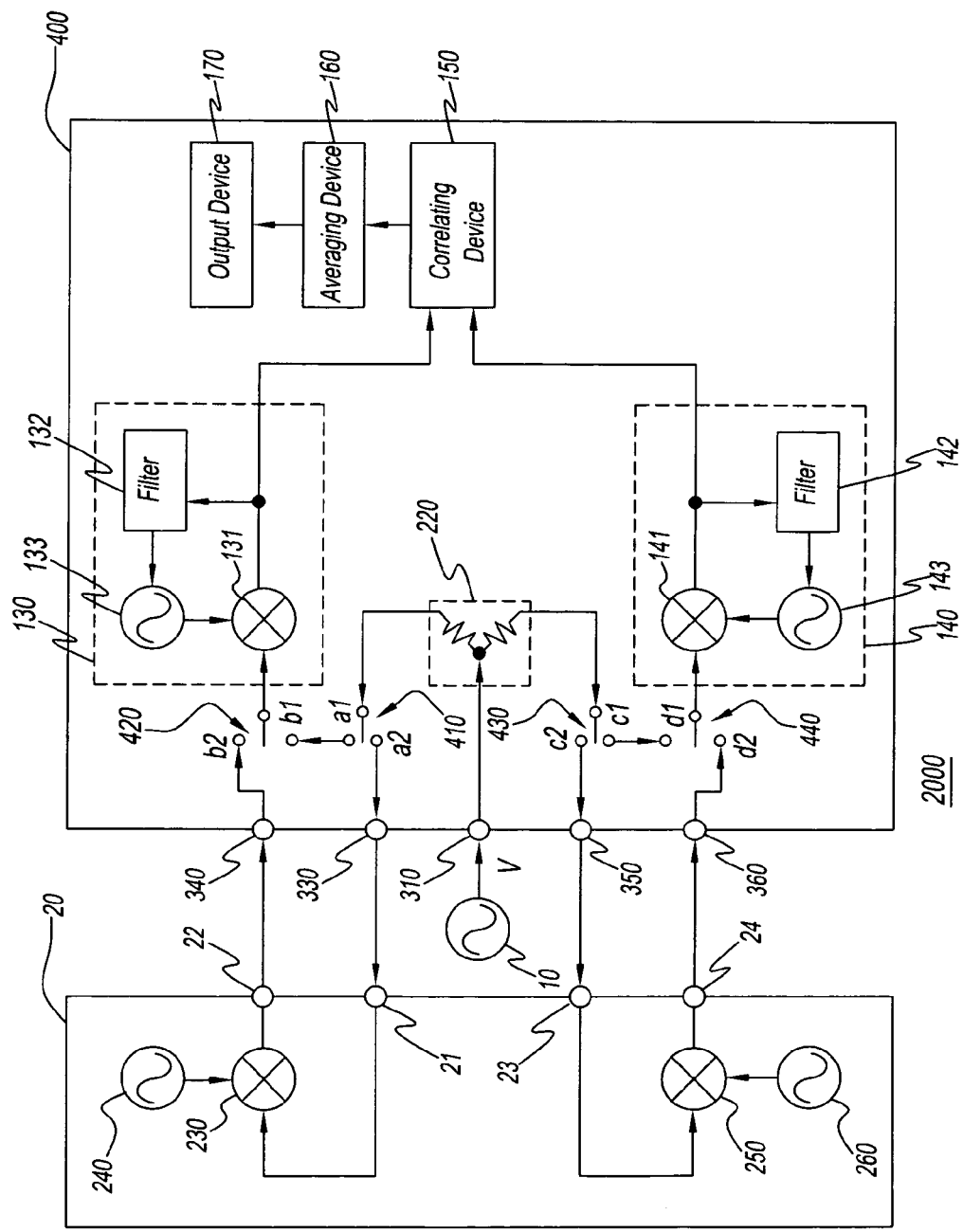
FIG. 6 is a block diagram showing the structure of the fourth embodiment of the present invention, phase noise measuring apparatus 2000.

Next, another phase noise measuring system capable of measuring the phase noise of V signals under test of a broader frequency range is described below as a fourth embodiment of the present invention. A block diagram showing the structure of the fourth embodiment of the present invention, a phase noise measuring system 2000, is shown in FIG. 6. The same reference symbols are used for the same structural elements as in FIG. 5 and a description thereof is omitted. Refer to FIG. 6 hereafter. Phase noise measuring system 2000 has frequency conversion box 20 and a phase noise measuring apparatus 400.

Phase noise measuring apparatus 400 in FIG. 6 is phase noise measuring apparatus 200 to which switches 410, 420, 430, and 440 have further been added. Distributor 220 is connected to switches 410 and 430 in place of output terminals 330 and 350. Moreover, output terminal 330 is connected to switch 410. Furthermore, output terminal 350 is connected to switch 430. PLL block 130 is connected to switch 420 in place of input terminal 340. Moreover, PLL block 140 is connected to switch 440 in place of input terminal 360. Input terminal 340 is connected to switch 420. Input terminal 360 is connected to switch 440. Switch 410 feeds one of the output signals of distributor 120 to output terminal 330 or switch 420. Switch 420 feeds signals from input terminal 340 or signals from switch 410 to PLL block 130. Switch 430 feeds one of the other output signals from distributor 120 to output terminal 350 or switch 440. Switch 440 feeds signals from input terminal 360 or signals from switch 430 to PLL block 140.

When V signals under test are of a relatively low frequency, switch 410 selects the a1 side, switch 420 selects the b1 side, switch 430 selects the c1 side, and switch 440 selects the d1 side. Each of the output signals of distributor 120 are fed to PLL block 130 and PLL block 140 without being processed. On the other hand, when V signals under test are of relatively high frequency, switch 410 selects the a2 side, switch 420 selects the b2 side, switch 430 selects the c2 side, and switch 440 selects the d2 side. Each of the output signals of distributor 120 are fed to PLL block 130 and PLL block 140 after separate frequency conversion. Phase noise measuring system 2000 is constructed as described above; therefore, there are fewer problems with the terminal connection that is associated with the selection of the measurement frequency range when compared to phase noise measuring system 1000.

Figure 7:
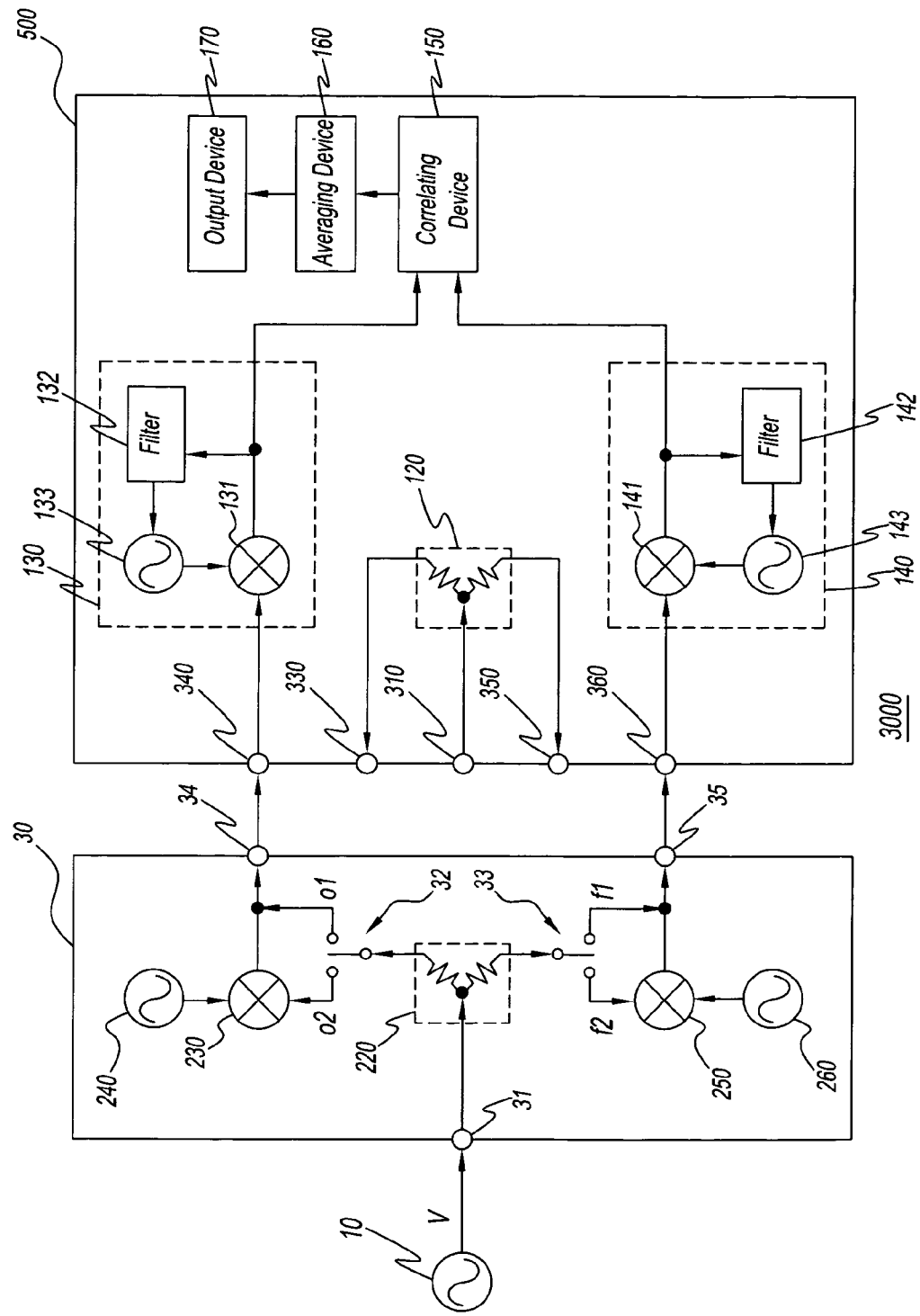
FIG. 7 is a block diagram showing the structure of the fifth embodiment of the present invention, phase noise measuring apparatus 3000.

Next, another phase noise measuring system capable of measuring the phase noise of signals under test of a broader frequency range will be described as the fifth embodiment of the present invention. A block diagram showing the structure of the fifth embodiment of the present invention, a phase noise measuring system 3000, is shown in FIG. 7. The same reference symbols are used for the same structural elements as in FIG. 5 and a description thereof is omitted. Refer to FIG. 7 hereafter. Phase noise measuring system 3000 has a frequency conversion box 30 and a phase noise measuring apparatus 500.

Phase noise measuring apparatus 500 has distributor 120 in place of distributor 220 in phase noise measuring apparatus 300. Distributor 120 is the same as the distributor shown in FIG. 1 and has a narrower bandwidth when compared to distributor 220.

Frequency conversion box 30 has an input terminal 31, a distributor 220, signal sources 240 and 260, mixers 230 and 250, switches 32 and 33, and output terminals 34 and 35. Input terminal 31 is the terminal for receiving V signals under test. Distributor 220 is the device that distributes V signals under test that have been received at input terminal 31, outputting these signals to switches 32 and 33. Switch 32 feeds the distributed signals to mixer 230 or output terminal 34. Switch 33 feeds the distributed signals to mixer 250 or output terminal 35. Mixer 230 is connected to signal source 240. Moreover, mixer 230 converts the frequency of the output signals of switch 32 and outputs these signals to output terminal 34. Mixer 250 is connected to signal source 260. Moreover, mixer 250 frequency converts the output signals of switch 33 and outputs these signals to output terminal 35. Output terminal 34 is connected to input terminal 340. Moreover, output terminal 35 is connected to input terminal 360.

When V signals under test are of relatively low frequency, switch 32 selects the e1 side and switch 33 selects the f1 side. Direct-current signals are further output from signal sources 240 and 260. The output signals from distributor 220 are fed to phase noise measuring device 500 unprocessed at this time. When V signals under test are of relatively high frequency, switch 32 selects the e2 side and switch 33 selects the f2 side. The output signals from distributor 220 are supplied frequency converted and then fed to phase noise measuring device 500. Frequency conversion box 30 has a connector terminal (not illustrated) for receiving control information from phase noise measuring apparatus 500 or a PC or another external control device. The frequency of the output signals of signal source 240 and signal source 260 is controlled by phase noise measuring apparatus 500. The selection status of switches 32 and 33 is controlled by phase noise measuring apparatus 500. Phase noise measuring system 3000 is structured as described above; therefore, it is possible to reduce the problems associated with terminal connection when the measured frequency range is selected.

Figure 8:
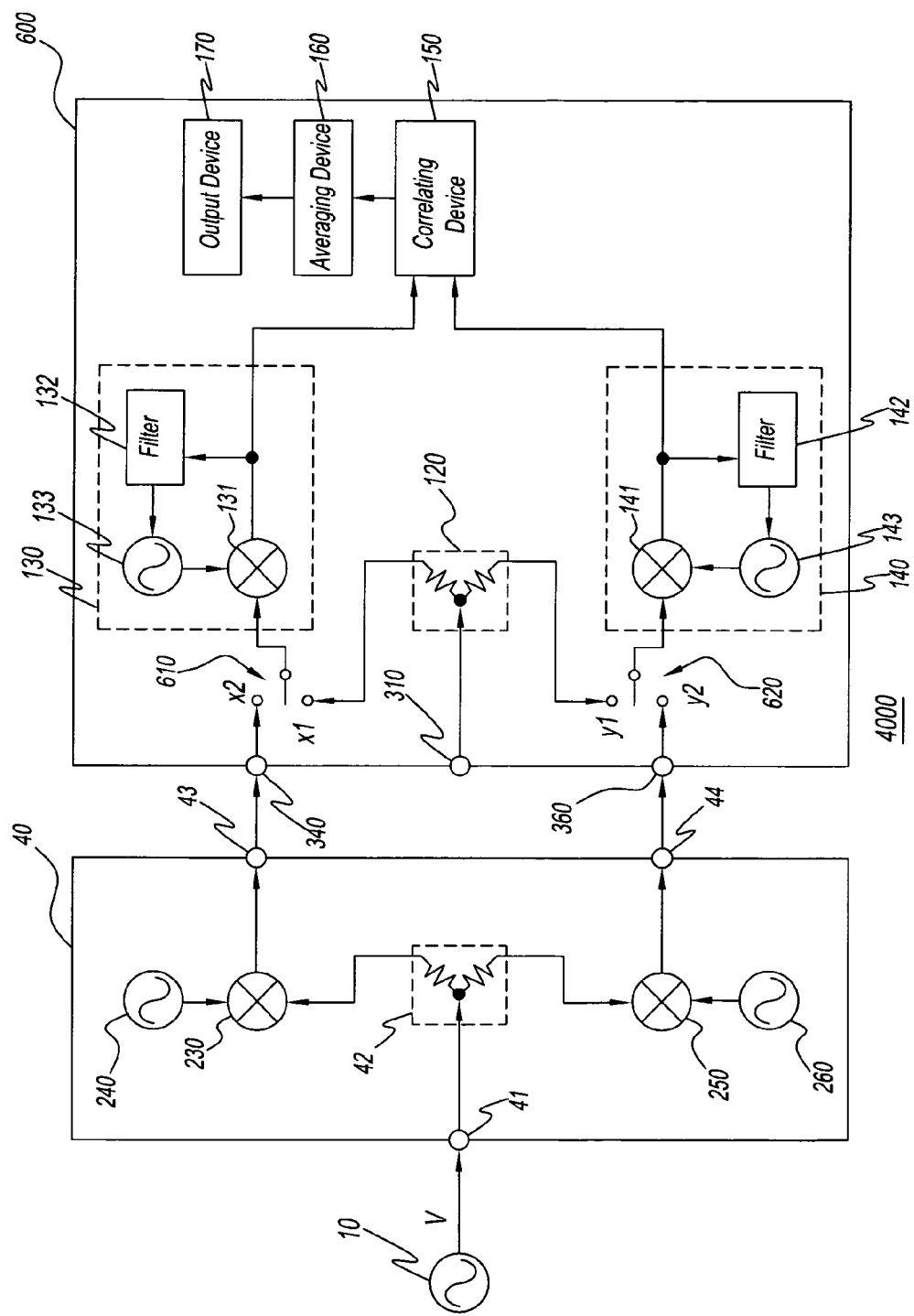
FIG. 8 is a block diagram showing the structure of the sixth embodiment of the present invention, phase noise measuring apparatus 4000.

Next, another phase noise measuring system capable of measuring the phase noise of signals under test of a broader frequency range will be described as the sixth embodiment of the present invention. A block diagram showing the structure of the sixth embodiment of the present invention, a phase noise measuring system 4000, is shown in FIG. 8. The same reference symbols are used in FIG. 8 for the same structural elements as in FIG. 7 and a description thereof is omitted. Refer to FIG. 8 hereafter. Phase noise measuring system 4000 has a frequency conversion box 40 and a phase noise measuring apparatus 600.

Phase noise measuring apparatus 600 is phase noise measuring apparatus 500 from which output terminals 330 and 350 have been removed and switches 610 and 620 have been added. Distributor 120 is connected to switches 610 and 620. Distributor 120 distributes V signals under test received at input terminal 310 and feeds each of the distributed signals to switches 610 and 620. PLL block 130 is connected to switch 610 in place of input terminal 340. Moreover, input terminal 340 is connected to switch 610. PLL block 140 is connected to switch 620 in place of input terminal 360. Input terminal 360 is connected to switch 620.

Frequency conversion box 40 has an input terminal 41, a distributor 42, signal sources 240 and 260, and mixers 230 and 250. Input terminal 41 is the terminal for receiving V signals under test. Distributor 42 is the device that distributes V signals under test that have been received at input terminal 41 and feeds these signals to mixers 230 and 250. Mixer 230 is connected to signal source 240. Mixer 230 converts the frequency of one of the signals distributed by distributor 42 and outputs this to output terminal 43. Mixer 250 is connected to signal source 260. Moreover, mixer 250 converts the frequency of one of the other signals distributed by distributor 42 and outputs this to output terminal 44. Output terminal 43 is connected to input terminal 340. Output terminal 44 is connected to input terminal 360.

When the V signals under test are of relatively low frequency, device under test 10 is connected to input terminal 310. Moreover, switch 610 of phase noise measuring apparatus 600 selects the x1 side and switch 620 selects the y1 side. One of the output signals of distributor 120 is fed through switch 610 to PLL block 130 at this time. Moreover, another one of the output signals of distributor 120 is fed through switch 620 to PLL block 140. On the other hand, when the V signals under test are of relatively high frequency, device under test 10 is connected to input terminal 41. Switch 610 of phase noise measuring apparatus 600 selects the x2 side and switch 620 selects the y2 side. The signals output from output terminal 43 are fed through switch 610 to PLL block 130 at this time. Moreover, the signals output from output terminal 44 are fed through switch 620 to PLL block 140. It should be noted that frequency conversion box 40 has a connector terminal (not illustrated) for receiving control information from phase noise measuring apparatus 600 or a PC or another external control apparatus. The frequency of the output signals of signal source 240 and signal source 260 is controlled by phase noise measuring apparatus 600. Phase noise measuring apparatus 600 is structured as described above; therefore, it is not necessary to detach frequency conversion box 40 when the measured frequency range changes.

Signal sources 133 and 143 can precisely set the frequency of the output signals in accordance with the frequency of V signals under test in the embodiments described thus far. In general, this type of a signal source produces a spurious effect having a frequency of $f_{SUPR}$ as represented by the following formula other than the desired frequency $f_{LO}$.

[Mathematical formula 12]

$$f_{SUPR} = |i \cdot f_{LO} \pm j \cdot f_{ref}| \quad (12)$$

The notations i and j here are integers of one or greater. $f_{Lo}$ is the frequency of the output signals of the signal source. Moreover, $f_{ref}$ is the reference signal frequency of this signal source.

This spurious frequency can have an effect on the results of measuring the phase noise of V signals under test. For instance, when frequency $f_{SUPR}$ is approximately the same as frequency $f_{LO}$, this spurious effect is measured as the phase noise of signals V under test. Therefore, a phase noise measuring apparatus that eliminates this type of spurious effect is described below as the seventh embodiment of the present invention.

Figure 9:
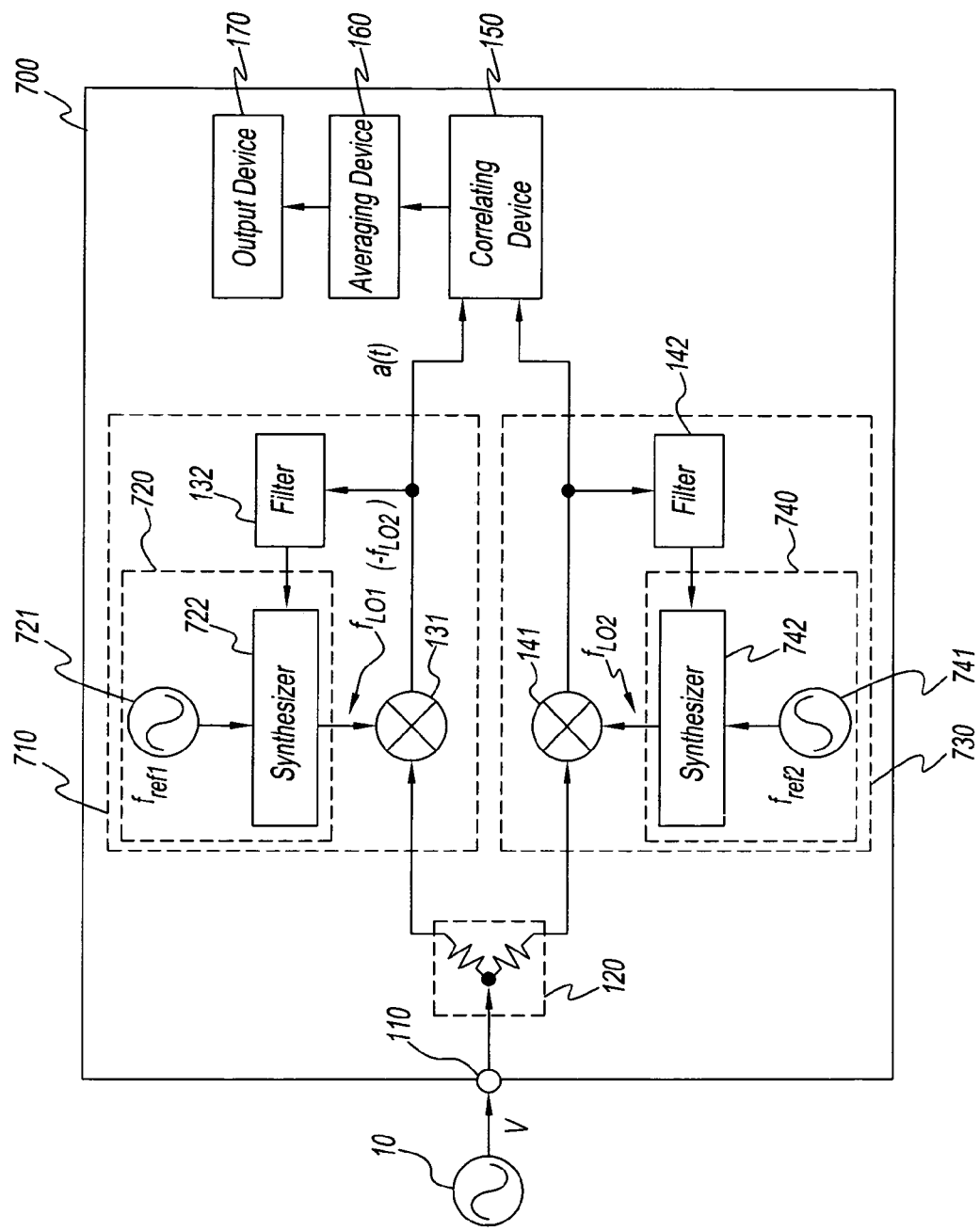
FIG. 9 is a block diagram showing the structure of the seventh embodiment of the present invention, phase noise measuring apparatus 700.

A block diagram showing the structure of the seventh embodiment of the present invention, a phase noise measuring apparatus 700, is shown in FIG. 9. The same reference symbols are used in FIG. 9 for the same structural elements as in FIG. 1 and a description thereof is omitted. Phase noise measuring apparatus 700 in FIG. 9 is phase noise measuring apparatus 100 wherein a PLL block 710 is substituted for PLL block 130 and a PLL block 730 is substituted for PLL block 140. PLL block 710 is PLL block 130 in which a signal source 720 has been substituted for a signal source 133. PLL block 730 is PLL block 140 in which a signal source 740 has been substituted for signal source 143.

Signal source 720 has a reference signal source 721 and a synthesizer 722. Synthesizer 722 generates and outputs local signals while referring to the output signals of reference signal source 721. The frequency and phase of the output signals of synthesizer 722 are controlled by the output signals of filter 132. Moreover, signal source 740 has a reference signal source 741 and a synthesizer 742. Synthesizer 742 generates and outputs local signals while referring to output signals of reference signal source 741. The frequency and phase of the output signals of synthesizer 742 are controlled by the output signals of filter 142. The frequency $f_{LO1}$ of the output signals of synthesizer 722 and the frequency $f_{LO2}$ of the output signals of synthesizer 742 are the same. On the other hand, frequency $f_{ref1}$ of the output signals of reference signal source 721 and frequency $f_{ref2}$ of the output signals of reference signal source 741 are different. When the spurious frequency output from synthesizer 722 at this time is $f_{SUPR1}$ and the spurious frequency output from synthesizer 742 is $F_{SUPR2}$, $f_{SUPR1} \neq f_{SUPR2}$. These spurious frequencies are treated as independent components by correlating device 150 that is placed downstream; therefore, they are brought to zero by averaging the cross spectrum. The spurious frequency-reducing effect increases as frequency $f_{ref1}$ and frequency $f_{ref2}$ grow farther apart, in broad perspective. Moreover, frequency $f_{ref1}$ and frequency $f_{ref2}$ should be separated by at least the predetermined frequency $f_{diff}$. It should be noted that frequency $f_{diff}$ is the reciprocal of the time at when one cross-spectrum processing targets (observation time). For instance, when 1024-point FFT processing is performed by correlation apparatus 150 on the results of analog-digital conversion at 32 kHz, one observation time is 32 milliseconds. Consequently, frequency $f_{diff}$ in this case becomes 31.25 Hz. Of course, even if frequency $f_{ref1}$ and frequency $f_{ref2}$ are not separated by at least the predetermined frequency $f_{diff}$, it does not means that there will be no spurious frequency-reducing effect at all. The extent to which frequency $f_{ref1}$ and frequency $f_{ref2}$ are separated from one another depends how to reduce the spurious effect. The above-mentioned technology for reducing the spurious effect can also be used with the phase noise measuring apparatuses in the other embodiments. For instance, the frequency of the reference signal source for signal source 133 and signal source 143 should be different in phase noise measuring device 200. In this case, it is not necessary for the frequency of the output signals of signal source 133 and the frequency of the output signals of signal source 143 to be the same. Moreover, it is better if the frequency of the reference signal sources of signal sources 240, 260, 133, and 143 in phase noise measuring apparatus 200 are different.

Figure 10:
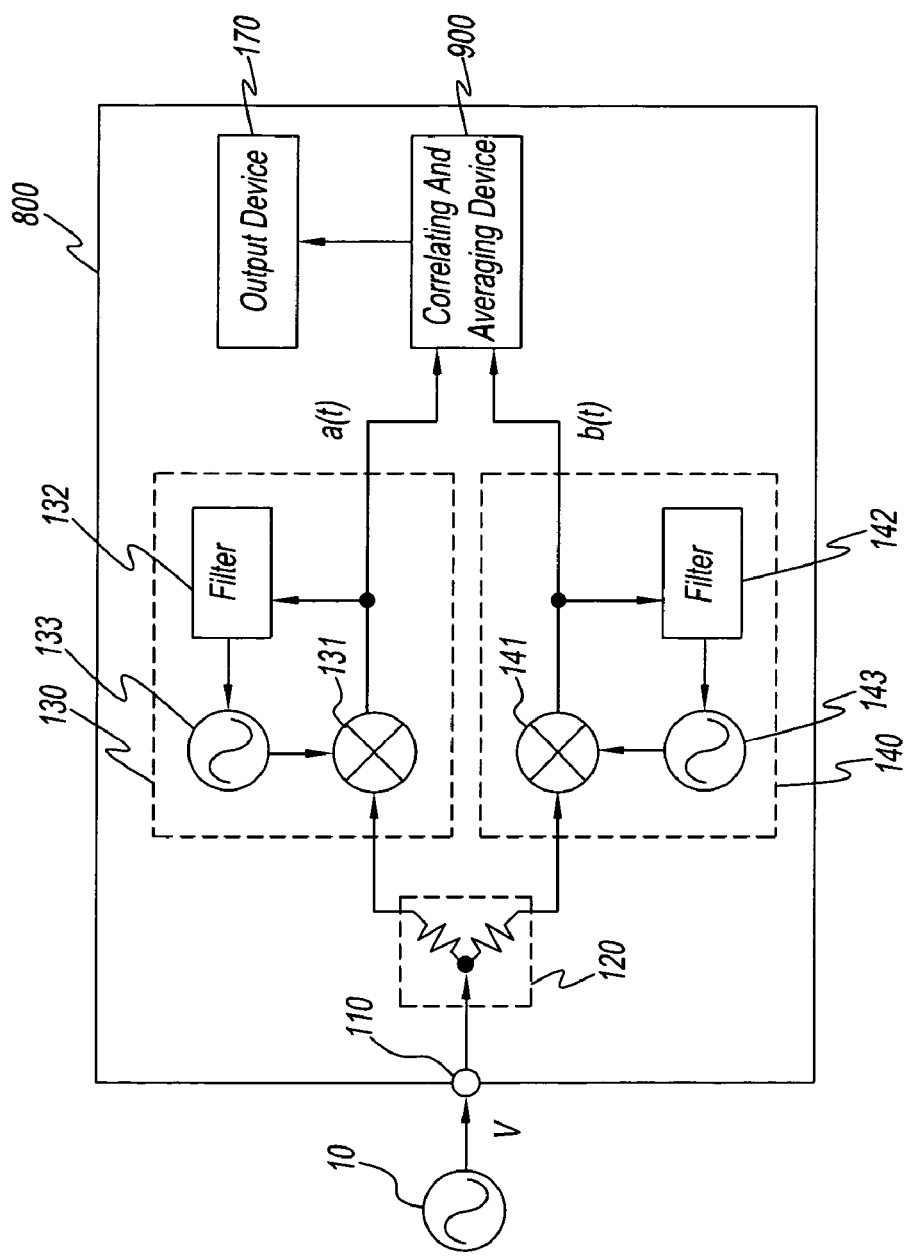
FIG. 10 is a block diagram showing the structure of the eighth embodiment of the present invention, phase noise measuring apparatus 800.

Nevertheless, when the entire bandwidth of a spectrum is processed at high frequency resolution, additional measurement resources are needed. A phase noise measuring apparatus that solves this type of problem is described below as an eighth embodiment of the present invention. Refer to FIG. 10 here. FIG. 10 is a drawing showing the eighth embodiment of the present invention, a phase noise measuring apparatus 800. The same reference symbols are used in FIG. 10 for the same structural elements as in FIG. 1 and a description is therefore omitted.

Phase noise measuring apparatus 800 in FIG. 10 has input terminal 110, distributor 120, PLL block 130, PLL block 140, a correlation averaging device 900, and output device 170. Correlation averaging device 900 finds the cross spectrum between phase signals a(t), which are the output signals of PLL block 130, and phase signals b(t), which are the output signals of PLL block 140. Correlation averaging device 900 further averages the resulting cross spectra.

Figure 11:
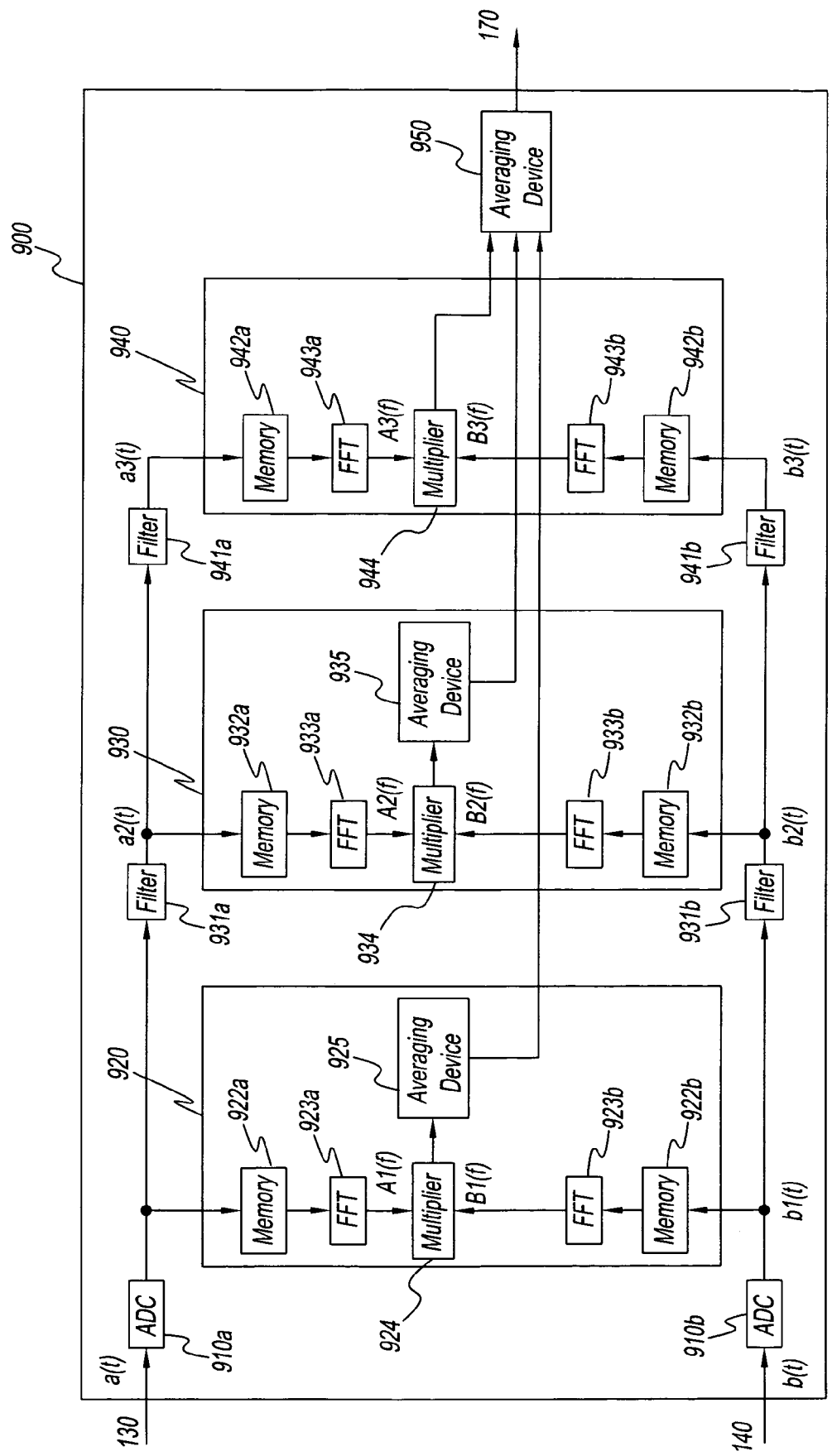
FIG. 11 is a block diagram showing phase noise measuring apparatus 900.

Correlation averaging device 900 will be described in detail while referring to FIG. 11 here. FIG. 11 is a drawing showing the structure of correlation averaging device 900. In FIG. 11, correlation averaging device 900 has an ADC 910a, an ADC 910b, a correlating block 920, a correlating block 930, a filter 931a, a filter 931b, a correlating block 940, a filter 941a, a filter 941b, and an averaging device 950. ADC 910a is the device that performs analog-digital conversion of phase signals a(t). ADC 910b is the device that performs analog-digital conversion of phase signals b(t). ADC 910a and ADC 910b have the same conversion speed fs (samples/second). Phase signal a1(t), which is the result of conversion by ADC 910a, and phase signal b1(t), which is the result of conversion by ADC 910b, are input to correlation block 920. Filters 931a, 931b, 941a, and 941b are ⅛ decimation filters. Filter 931a brings the bandwidth and rate of phase signal a1(t) to ⅛. Filter 931b brings the bandwidth and rate of phase signal b1(t) to ⅛. Filter 941a brings the bandwidth and rate of phase signal a2(t), which is the output of filter 931a, to ⅛. Filter 941b brings the bandwidth and rate of phase signal b2(t), which is the output of filter 931b, to ⅛.

Correlating block 920 is the device that produces the cross spectrum between phase signals a1(t) and phase signals b1(t). Correlating block 920 has a memory 922a, a memory 922b, an FFT 923a, an FFT 923b, a multiplier 924, and an averaging device 925. Memory 922a is the device that stores phase signals a1(t). FFT 923a Fourier transforms phase signals a1(t) stored in memory 922a. Moreover, component A1(f) with a Nyquist frequency of (fs/2) or lower from among the results of Fourier transform of phase signals a1(t) are output to multiplier 924. Memory 922b is the device that stores phase signals b1(t). FFT 923b performs Fourier transform of phase signals b1(t) stored in memory 922b. Moreover, component B1(f) with a Nyquist frequency of (fs/2) or less is output to multiplier 924 from the results of Fourier transform of phase signals b1(t). FFT 923a and FFT 923b have the same number of points. Multiplier 924 processes the Fourier transform result A1(f) and the Fourier transform result B1(f) as shown by the following formula.

[Mathematical formula 13]

$$S1_{ab}(f) = A1(f)B1(f)^* \qquad (13)$$

$S1_{ab}(f)$ is the cross spectrum of a1(t) and b1(t). Moreover, the asterisk (*) indicates a complex conjugation.

$S1_{ab}(f)$, which is the result of the processing performed by multiplier 924, is output to averaging device 925. Averaging device 925 performs vector averaging in terms of time on processing result $S1_{ab}(f)$ in accordance with the following formula.

[Mathematical formula 14]

$$AS1_{ab}(f) = \frac{1}{64}\sum_{k=1}^{64} S1_{ab}(k, f) \qquad (14)$$

$S1_{ab}(k,f)$ is cross spectrum $S1_{ab}(f)$ obtained after k iterations.

The averaged cross spectrum $AS1_{ab}(f)$, which is the result of processing by averaging unit 925, is output to averaging unit 950.

Correlating block 930 is the device that produces a cross spectrum between phase signals $a2(t)$ and phase signals $b2(t)$. Correlating block 930 has a memory 932a, a memory 932b, an FFT 933a, an FFT 933b, a multiplier 934, and an averaging unit 935. Memory 932a is the device that stores phase signals $a2(t)$. FFT 933a performs Fourier transform of phase signals $a2(t)$ stored in memory 932a. Moreover, component $A2(f)$ with a Nyquist frequency of (fs/16) or lower is output to multiplier 934 from the results of Fourier transform of phase signals $a2(t)$. Memory 932b is the device that stores phase signals $b2(t)$. FFT 933b performs Fourier transform of phase signals $b2(t)$ stored in memory 932b. Moreover, component $B2(f)$ with a Nyquist frequency of (fs/16) or less is output to multiplier 934 from the results of Fourier transform of phase signals $b2(t)$. It should be noted that FFT 933a and FFT 933b have the same number of points. Multiplier 934 processes Fourier transform result $A2(f)$ and Fourier transform result $B2(f)$ in accordance with the following formula.

[Mathematical formula 15]

$$S2_{ab}(f) = A2(f)B2(f)^* \quad (15)$$

$S2_{ab}(f)$ is the cross spectrum between $a2(t)$ and $b2(t)$. Moreover, the asterisk (*) indicates complex conjugation.

$S2_{ab}(f)$, which is the result of processing by multiplier 934, is output to averaging unit 935. Averaging unit 935 performs vector averaging in terms of time on processing result $S2_{ab}(f)$ in accordance with the following formula.

[Mathematical formula 16]

$$AS2_{ab}(f) = \frac{1}{8}\sum_{k=1}^{8} S2_{ab}(k, f) \quad (16)$$

$S2_{ab}(k,f)$ is the cross spectrum $S2_{ab}(f)$ obtained after k iterations.

The averaged cross spectrum $AS2_{ab}(f)$, which is the result of processing by averaging unit 935, is output to averaging unit 950.

Correlating block 940 is the device that produces the cross spectrum between phase signals $a3(t)$, which represents the output of filter 941a, and phase signals $b3(t)$, which represents the output of filter 941b. Correlation processing block 940 has a memory 942a, a memory 942b, an FFT 943a, an FFT 943b, and a multiplier 944. Memory 942a is the device that stores phase signals $a3(t)$. FFT 943a performs Fourier transform of phase signals $a3(t)$ stored in memory 942a. Moreover, component $A3(f)$ with a Nyquist frequency of (fs/128) or less is output to multiplier 944 from the results of Fourier transform of phase signals $a3(t)$. Memory 942b is the device that stores phase signal $b3(t)$. FFT 943b performs Fourier transform of phase signals $b3(t)$ stored in memory 942b. Moreover, component $B33(f)$ with a Nyquist frequency of (fs/128) or less is output to multiplier 944 from the results of Fourier transform of phase signals $b3(t)$. FFT 923a and FFT 923b have the same number of points. Multiplier 944 processes Fourier transform result $A3(f)$ and Fourier transform result $B3(f)$ in accordance with the following formula.

[Mathematical formula 17]

$$S3_{ab}(f) = A3(f)B3(f)^* \quad (17)$$

$S3_{ab}(f)$ is the cross spectrum between $a3(t)$ and $b3(t)$. Moreover, the asterisk (*) indicates complex conjugation.

$S3_{ab}(f)$, which is the result of processing by multiplier 944, is output to averaging unit 950.

It should be kept in mind that when one $S3_{ab}(f)$ value is obtained, eight $S2_{ab}(f)$ values are obtained and 64 $S1_{ab}(f)$ values are obtained. The eight $S2_{ab}(f)$ values are averaged to become one $AS2_{ab}(f)$ value. Moreover, the 64 $S1_{ab}(f)$ values are averaged to become one $AS1_{ab}(f)$ value.

Processing results $AS1_{ab}(f)$, $AS2_{ab}(f)$, and $S3_{ab}(f)$ of each correlating block correspond to linearly spaced frequencies. However, at least the frequency axis is displayed with a log scale in the measurement results of phase noise. Consequently, processing results $AS1_{ab}(f)$, $AS2_{ab}(f)$, and $S3_{ab}(f)$ must be mapped to logarithmically spaced frequencies. Therefore, one cross spectrum mapped to logarithmically spaced frequencies is produced by combining the processing results $As1_{ab}(f)$, $As2_{ab}(f)$, and $S3_{ab}(f)$ of each correlating block. An example of this procedure is described below.

First, the conversion speed of ADC 910a and ADC 910b is 100 M samples/second. The number of FFT points in each correlating block is 128 points. The FFT points in correlating block 920 at this time is as shown in Table 4. Moreover, the FFT points in correlating block 930 are as shown in Table 5. The FFT points in correlating block 940 are as shown in Table 6. Only the points with Nyquist frequency or less are shown together with the corresponding frequency in these tables.

TABLE 4

| FFT points | |
| --- | --- |
| Count | Frequency |
| 0 | 0 |
| 1 | 781,250 |
| 2 | 1,562,500 |
| 3 | 2,343,750 |
| 4 | 3,125,000 |
| 5 | 3,906,250 |
| 6 | 4,687,500 |
| 7 | 5,468,750 |
| 8 | 6,250,000 |
| 9 | 7,031,250 |
| 10 | 7,812,500 |
| 11 | 8,593,750 |
| 12 | 9,375,000 |
| 13 | 10,156,250 |
| 14 | 10,937,500 |
| 15 | 11,718,750 |
| 16 | 12,500,000 |
| 17 | 13,281,250 |
| 18 | 14,062,500 |
| 19 | 14,843,750 |
| 20 | 15,625,000 |
| 21 | 16,406,250 |
| 22 | 17,187,500 |
| 23 | 17,968,750 |
| 24 | 18,750,000 |
| 25 | 19,531,250 |
| 26 | 20,312,500 |
| 27 | 21,093,750 |
| 28 | 21,875,000 |
| 29 | 22,656,250 |
| 30 | 23,437,500 |
| 31 | 24,218,750 |
| 32 | 25,000,000 |
| 33 | 25,781,250 |
| 34 | 26,562,500 |
| 35 | 27,343,750 |

TABLE 4-continued

| FFT points | |
|---|---|
| Count | Frequency |
| 36 | 28,125,000 |
| 37 | 28,906,250 |
| 38 | 29,687,500 |
| 39 | 30,468,750 |
| 40 | 31,250,000 |
| 41 | 32,031,250 |
| 42 | 32,812,500 |
| 43 | 33,593,750 |
| 44 | 34,375,000 |
| 45 | 35,156,250 |
| 46 | 35,937,500 |
| 47 | 36,718,750 |
| 48 | 37,500,000 |
| 49 | 38,281,250 |
| 50 | 39,062,500 |
| 51 | 39,843,750 |
| 52 | 40,625,000 |
| 53 | 41,406,250 |
| 54 | 42,187,500 |
| 55 | 42,968,750 |
| 56 | 43,750,000 |
| 57 | 44,531,250 |
| 58 | 45,312,500 |
| 59 | 46,093,750 |
| 60 | 46,875,000 |
| 61 | 47,656,250 |
| 62 | 48,437,500 |
| 63 | 49,218,750 |
| 64 | 50,000,000 (Hz) |

TABLE 5

| FFT points | |
|---|---|
| Count | Frequency (Hz) |
| 0 | 0 |
| 1 | 97,656 |
| 2 | 195,313 |
| 3 | 292,969 |
| 4 | 390,625 |
| 5 | 488,281 |
| 6 | 585,938 |
| 7 | 683,594 |
| 8 | 781,250 |
| 9 | 878,906 |
| 10 | 976,563 |
| 11 | 1,074,219 |
| 12 | 1,171,875 |
| 13 | 1,269,531 |
| 14 | 1,367,188 |
| 15 | 1,464,844 |
| 16 | 1,562,500 |
| 17 | 1,660,156 |
| 18 | 1,757,813 |
| 19 | 1,855,469 |
| 20 | 1,953,125 |
| 21 | 2,050,781 |
| 22 | 2,148,438 |
| 23 | 2,246,094 |
| 24 | 2,343,750 |
| 25 | 2,441,406 |
| 26 | 2,539,063 |
| 27 | 2,636,719 |
| 28 | 2,734,375 |
| 29 | 2,832,031 |
| 30 | 2,929,688 |
| 31 | 3,027,344 |
| 32 | 3,125,000 |
| 33 | 3,222,656 |

TABLE 5-continued

| FFT points | |
|---|---|
| Count | Frequency (Hz) |
| 34 | 3,320,313 |
| 35 | 3,417,969 |
| 36 | 3,515,625 |
| 37 | 3,613,281 |
| 38 | 3,710,938 |
| 39 | 3,808,594 |
| 40 | 3,906,250 |
| 41 | 4,003,906 |
| 42 | 4,101,563 |
| 43 | 4,199,219 |
| 44 | 4,296,875 |
| 45 | 4,394,531 |
| 46 | 4,492,188 |
| 47 | 4,589,844 |
| 48 | 4,687,500 |
| 49 | 4,785,156 |
| 50 | 4,882,813 |
| 51 | 4,980,469 |
| 52 | 5,078,125 |
| 53 | 5,175,781 |
| 54 | 5,273,438 |
| 55 | 5,371,094 |
| 56 | 5,468,750 |
| 57 | 5,566,406 |
| 58 | 5,664,063 |
| 59 | 5,761,719 |
| 60 | 5,859,375 |
| 61 | 5,957,031 |
| 62 | 6,054,688 |
| 63 | 6,152,344 |
| 64 | 6,250,000 (Hz) |

TABLE 6

| FFT points | |
|---|---|
| Count | Frequency (Hz) |
| 0 | 0 |
| 1 | 12,207 |
| 2 | 24,414 |
| 3 | 36,621 |
| 4 | 48,828 |
| 5 | 61,035 |
| 6 | 73,242 |
| 7 | 85,449 |
| 8 | 97,656 |
| 9 | 109,863 |
| 10 | 122,070 |
| 11 | 134,277 |
| 12 | 146,484 |
| 13 | 158,691 |
| 14 | 170,898 |
| 15 | 183,105 |
| 16 | 195,313 |
| 17 | 207,520 |
| 18 | 219,727 |
| 19 | 231,934 |
| 20 | 244,141 |
| 21 | 256,348 |
| 22 | 268,555 |
| 23 | 280,762 |
| 24 | 292,969 |
| 25 | 305,176 |
| 26 | 317,383 |
| 27 | 329,590 |
| 28 | 341,797 |
| 29 | 354,004 |
| 30 | 366,211 |

TABLE 6-continued

| FFT points | |
|---|---|
| Count | Frequency (Hz) |
| 31 | 378,418 |
| 32 | 390,625 |
| 33 | 402,832 |
| 34 | 415,039 |
| 35 | 427,246 |
| 36 | 439,453 |
| 37 | 451,660 |
| 38 | 463,867 |
| 39 | 476,074 |
| 40 | 488,281 |
| 41 | 500,488 |
| 42 | 512,695 |
| 43 | 524,902 |
| 44 | 537,109 |
| 45 | 549,316 |
| 46 | 561,523 |
| 47 | 573,730 |
| 48 | 585,938 |
| 49 | 598,145 |
| 50 | 610,352 |
| 51 | 622,559 |
| 52 | 634,766 |
| 53 | 646,973 |
| 54 | 659,180 |
| 55 | 671,387 |
| 56 | 683,594 |
| 57 | 695,801 |
| 58 | 708,008 |
| 59 | 720,215 |
| 60 | 732,422 |
| 61 | 744,629 |
| 62 | 756,836 |
| 63 | 769,043 |
| 64 | 781,250 |
|  | (Hz) |

The cross spectra corresponding to the linearly regularly spaced frequencies shown in Tables 4, 5 and 6 are brought to corresponding logarithmically spaced frequencies as shown in Table 7. The cross spectra are represented by 51 logarithmically spaced frequency points between 100 kHz and 45 MHz.

TABLE 7

| Display points | | | FFT count | | |
|---|---|---|---|---|---|
| Count | Frequency | Boundary Frequency | Block | Start point | End point |
|  |  | 94,074 |  |  |  |
| 0 | 100,000 |  | 940 | 8 | 8 |
|  |  | 106,300 |  |  |  |
| 1 | 112,996 |  | 940 | 9 | 9 |
|  |  | 120,115 |  |  |  |
| 2 | 127,682 |  | 940 | 10 | 11 |
|  |  | 135,725 |  |  |  |
| 3 | 144,276 |  | 940 | 12 | 12 |
|  |  | 153,365 |  |  |  |
| 4 | 163,026 |  | 940 | 13 | 14 |
|  |  | 173,296 |  |  |  |
| 5 | 184,213 |  | 940 | 15 | 16 |
|  |  | 195,818 |  |  |  |
| 6 | 208,154 |  | 940 | 17 | 18 |
|  |  | 221,267 |  |  |  |
| 7 | 235,207 |  | 940 | 19 | 20 |
|  |  | 250,024 |  |  |  |
| 8 | 265,775 |  | 940 | 21 | 23 |
|  |  | 282,518 |  |  |  |
| 9 | 300,316 |  | 940 | 24 | 26 |
|  |  | 319,235 |  |  |  |

TABLE 7-continued

| Display points | | | FFT count | | |
|---|---|---|---|---|---|
| Count | Frequency | Boundary Frequency | Block | Start point | End point |
| 10 | 339,346 |  | 940 | 27 | 29 |
|  |  | 360,724 |  |  |  |
| 11 | 383,448 |  | 940 | 30 | 33 |
|  |  | 407,604 |  |  |  |
| 12 | 433,282 |  | 940 | 34 | 37 |
|  |  | 460,578 |  |  |  |
| 13 | 489,593 |  | 940 | 38 | 42 |
|  |  | 520,436 |  |  |  |
| 14 | 553,222 |  | 940 | 43 | 47 |
|  |  | 588,074 |  |  |  |
| 15 | 625,121 |  | 940 | 49 | 54 |
|  |  | 664,501 |  |  |  |
| 16 | 706,363 |  | 940 | 55 | 61 |
|  |  | 750,862 |  |  |  |
| 17 | 798,164 |  | 930 | 8 | 8 |
|  |  | 848,446 |  |  |  |
| 18 | 901,896 |  | 930 | 9 | 9 |
|  |  | 958,713 |  |  |  |
| 19 | 1,019,109 |  | 930 | 10 | 11 |
|  |  | 1,083,310 |  |  |  |
| 20 | 1,151,556 |  | 930 | 12 | 12 |
|  |  | 1,224,101 |  |  |  |
| 21 | 1,301,216 |  | 930 | 13 | 14 |
|  |  | 1,383,189 |  |  |  |
| 22 | 1,470,326 |  | 930 | 15 | 16 |
|  |  | 1,562,952 |  |  |  |
| 23 | 1,661,414 |  | 930 | 17 | 18 |
|  |  | 1,766,078 |  |  |  |
| 24 | 1,877,336 |  | 930 | 19 | 20 |
|  |  | 1,995,603 |  |  |  |
| 25 | 2,121,320 |  | 930 | 21 | 23 |
|  |  | 2,254,958 |  |  |  |
| 26 | 2,397,014 |  | 930 | 24 | 26 |
|  |  | 2,548,019 |  |  |  |
| 27 | 2,708,537 |  | 930 | 27 | 29 |
|  |  | 2,879,167 |  |  |  |
| 28 | 3,060,547 |  | 930 | 30 | 33 |
|  |  | 3,253,353 |  |  |  |
| 29 | 3,458,305 |  | 930 | 34 | 37 |
|  |  | 3,676,168 |  |  |  |
| 30 | 3,907,757 |  | 930 | 38 | 42 |
|  |  | 4,153,934 |  |  |  |
| 31 | 4,415,621 |  | 930 | 43 | 48 |
|  |  | 4,693,792 |  |  |  |
| 32 | 4,989,488 |  | 930 | 49 | 54 |
|  |  | 5,303,812 |  |  |  |
| 33 | 5,637,938 |  | 930 | 55 | 61 |
|  |  | 5,993,112 |  |  |  |
| 34 | 6,370,661 |  | 920 | 8 | 8 |
|  |  | 6,771,995 |  |  |  |
| 35 | 7,198,612 |  | 920 | 9 | 9 |
|  |  | 7,652,104 |  |  |  |
| 36 | 8,134,166 |  | 920 | 10 | 11 |
|  |  | 8,646,595 |  |  |  |
| 37 | 9,191,307 |  | 920 | 12 | 12 |
|  |  | 9,770,333 |  |  |  |
| 38 | 10,385,837 |  | 920 | 13 | 14 |
|  |  | 11,040,116 |  |  |  |
| 39 | 11,735,612 |  | 920 | 15 | 15 |
|  |  | 12,474,923 |  |  |  |
| 40 | 13,260,809 |  | 920 | 16 | 18 |
|  |  | 14,096,203 |  |  |  |
| 41 | 14,984,224 |  | 920 | 19 | 20 |
|  |  | 15,928,188 |  |  |  |
| 42 | 16,931,620 |  | 920 | 21 | 23 |
|  |  | 17,998,265 |  |  |  |
| 43 | 19,132,105 |  | 920 | 24 | 26 |
|  |  | 20,337,375 |  |  |  |
| 44 | 21,618,572 |  | 920 | 27 | 29 |
|  |  | 22,980,482 |  |  |  |
| 45 | 24,428,188 |  | 920 | 30 | 33 |
|  |  | 25,967,096 |  |  |  |
| 46 | 27,602,951 |  | 920 | 34 | 37 |
|  |  | 29,341,860 |  |  |  |

TABLE 7-continued

| | Display points | | | FFT count | |
|---|---|---|---|---|---|
| Count | Frequency | Boundary Frequency | Block | Start point | End point |
| 47 | 31,190,315 | | 920 | 38 | 42 |
| | | 33,155,218 | | | |
| 48 | 35,243,904 | | 920 | 43 | 47 |
| | | 37,464,172 | | | |
| 49 | 39,824,310 | | 920 | 48 | 54 |
| | | 42,333,131 | | | |
| 50 | 45,000,000 (Hz) | | 920 | 55 | 61 |
| | | 47,834,875 (Hz) | | | |

The display points and corresponding frequencies are shown in Table 7. The frequency corresponding to a middle point between the adjacent display points is shown as the boundary frequency. By means of this procedure, linearly spaced frequency points between these boundary frequencies are selected. The cross spectrum corresponding to the selected frequency point is vector averaged. In the end, the averaging results serve as the cross spectrum of logarithmically spaced display points.

For instance, the cross spectrum of the display point of count 8 is obtained as follows. First, the boundary frequency on either side of the display point of count 8 is referenced. That is, the boundary frequencies of 250,024 Hz and 282,518 Hz are referenced. Next, the FFT points included within these two frequencies are found from Tables 4, 5, and 6. In order to discover as many FFT points as possible, the points are found in order beginning with table showing the smallest frequency spacing. That is, the FFT points are found in accordance with the order of Tables 6, Table 5, and Table 4. Thus, FFT points from count 21 to count 23 are found in Table 6 relating to correlating block 940. Next, the vector average of the cross spectrum at the three resulting FFT points is found. The cross spectrum obtained by averaging is the cross spectrum of the display point at count 8. Moreover, the cross spectrum of the display point of count 17 is obtained as follows. The boundary frequency on either side of the display point of count 17 is 750,862 Hz and 848,446 Hz. The FFT points of count 62 to count 64 is discovered in Table 6. Frequency components exceeding the Nyquist frequency not shown in Table 6. The values (793,457 Hz, 805,664 Hz, 817,871 Hz, 830,078 Hz, 842,285 Hz) are included between the 750,862 Hz and 848,446 Hz. Vector averaging of this component is the main cause of error in the measurement results; therefore, it is unacceptable. Consequently, FFT points are similarly found from Table 5 relating to correlating block 930. When this is done, FFT points of count 8 are found in Table 5. When there is one FFT point, the original value is the same as the averaged value. Consequently, the cross spectrum at the FFT point of count 8 becomes the cross spectrum of the display point of count 17. The starting point and end point of the related FFT point and the correlating block related to these points are shown in Table 7.

When two or more FFT points are found, vector averaging in terms of frequency is performed on the cross spectrum. The phase noise component generated by signal source 133 and the phase noise component generated by signal source 143 approach zero as the number of averaging objects increases.

By means of the method illustrated above, the spectrum included within a predetermined frequency range from logarithmically spaced frequencies is selected from spectra corresponding to linearly spaced frequencies and the selected spectrum is vector averaged. The method whereby a spectrum corresponding to linearly spaced frequencies is vector averaged in terms of frequency as the number of averaging objects increases logarithmically with an increase in frequency is another method of mapping a cross spectrum corresponding to linearly spaced frequencies to correspond to logarithmically spaced frequencies. There are cases where it is actually difficult to arrange each frequency point with perfectly regularly spacing due to insufficient calculation precision, and the like. In this case, each frequency point should be arranged with approximately regularly spacing.

The one cross spectrum obtained from the processing results $AS1_{ab}(f)$, $AS2_{ab}(f)$, and $S3_{ab}(f)$ become $SW_{ab}(f)$ as a result of the vector averaging in terms of frequency described above. Correlation averaging device 900 finds a predetermined number of cross spectra $SW_{ab}(f)$ only. Moreover, averaging unit 950 vector averages cross spectrum $SW_{ab}(f)$ in terms of time as represented by the following formula.

[Mathematical formula 18]

$$ASW_{ab}(f) = \frac{1}{N}\sum_{k=1}^{N} SW_{ab}(k, f) \qquad (18)$$

N is an integer of 1 or higher. $SW_{ab}(k,f)$ is the cross spectrum $SW_{ab}(f)$ obtained after k iterations. The phase noise component generated by signal source 133 and the phase noise component generated by signal source 143 can move closer to zero with an increase in the number N of cross spectra, which are the objects of averaging.

Figure 12:
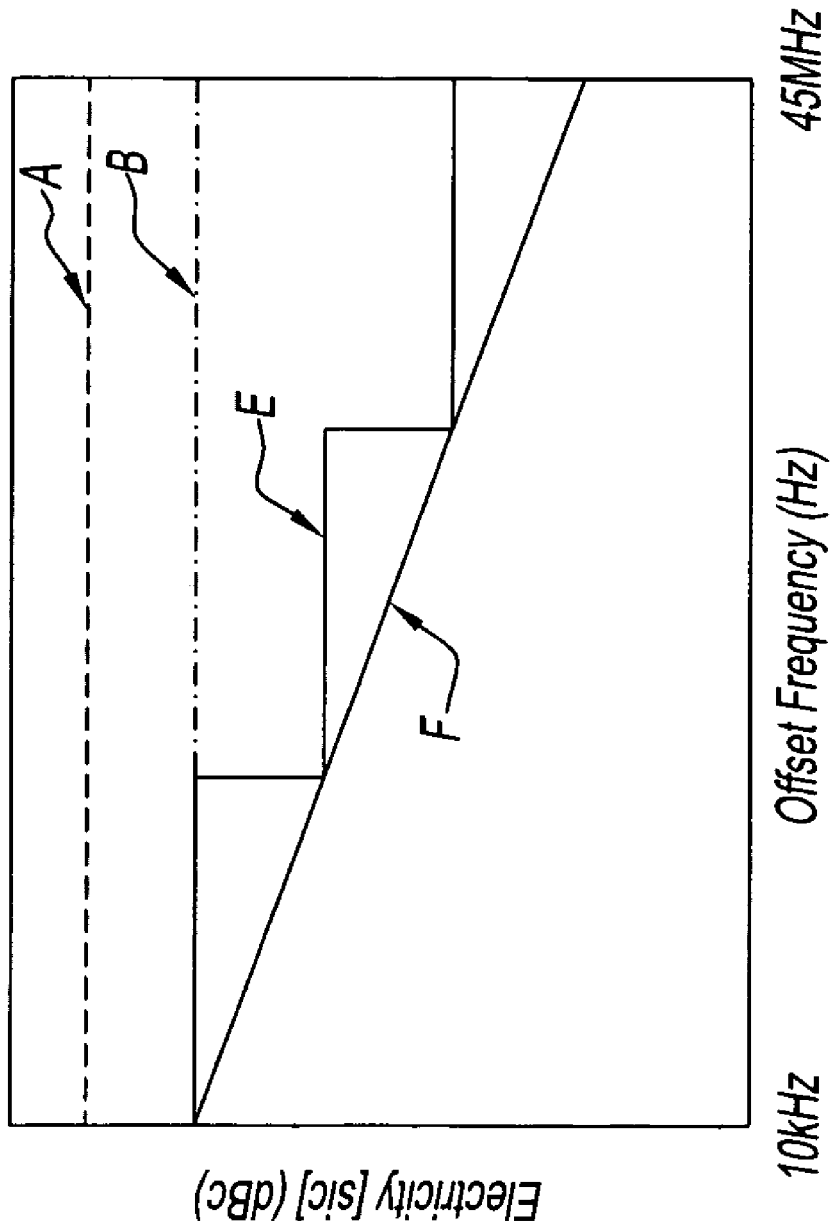
FIG. 12 is a drawing showing the averaging results.

Next, a graph showing the results of averaging is shown in FIG. 12. FIG. 12 shows the cross spectrum when ideal V signals under test free of any phase noise whatsoever are input to phase noise measuring apparatus 800 represented by a logarithmic graph. The y-axis in the graph in FIG. 12 is power and the x-axis is the offset frequency. The curve shown in FIG. 12 is so-called noise floor. Curves A and B in FIG. 12 are shown in FIG. 3. The real curve A is not a horizontal line and actually drops off gradually with an increase in frequency. However, in order to simplify the description, it is assumed in the present Specification that curve A is a horizontal line. Curves E and F are the difference to curve A. Curve E is the cross spectrum when a plurality of cross spectra that had not been vector averaged in terms of frequency were found and the resulting plurality of cross spectra were vector averaged in terms of time by correlation averaging device 900. Curve E is in step form because of the averaging results from averaging units 925 and 935. Moreover, curve F is the cross spectrum when the cross spectrum $SW_{ab}(f)$ that had been vector averaged in terms of frequency was found multiple times and the resulting plurality of cross spectra were vector averaged in terms of time. Curve F gradually drops off with an increase in frequency. In general, the phase noise decreases with an increase in offset frequency; therefore, the shape of curve F is preferred.

An averaged cross spectrum $ASW_{ab}(k, f)$ is eventually output to output device 170.

It should be noted that vector averaging in terms of frequency described above can be performed after vector averaging in terms of time. In this case, for instance, a new averaging unit is added after multiplier 944. Moreover, when the number of times averaging is performed by this averaging unit is m, the number of times averaging is performed by averaging unit 935 becomes (8·m), the number of times averaging is performed by averaging unit 925 becomes (64·m), and averaging unit 950 performs averaging in terms of frequency only.

By means of the eighth embodiment, the cross spectrum of two phase signals is found for a plurality of frequency ranges having different frequency bands. That is, correlating blocks 920, 930, and 940 having different frequency bands are essentially assigned a frequency band and the cross spectrum is found. As a result, it is not necessary for each correlating block to have excess operating functions. For instance, the total amount of memory inside each correlating block is much smaller than the amount of memory needed when a frequency band is not assigned. Moreover, when the plurality of cross spectra are obtained within the predetermined same time, correlating blocks 920, 930, and 940 perform vector averaging in terms of time on the respectively resulting plurality of cross spectra. As a result, measurement resources are conserved and measurement accuracy is improved in that noise flow is reduced.

The following modifications can be applied to each of the embodiments described thus far.

The decimation rate can be selected as needed in the eighth embodiment. Moreover, the decimation rate of each decimation filter is not necessarily the same. For instance, when the conversion speed of ADC 910a and ADC 910b is the same, the decimation of filters 931a, 931b, 941a, and 941b can be ¼. When the conversion speed of ADC 910a and ADC 910b is the same, the decimation rate of filters 931a and 931b can be ¼ and that of filters 941a and 941b can be ¹⁄₁₆.

The number of correlating blocks in the eighth embodiment is not limited to three. There can be more than three or less than three correlating blocks.

The number of FFT points in each of the above-mentioned embodiments can be selected as needed. Moreover, the number of points of two FFTs connected to the multiplier is not necessarily the same as long as this does not complicate processing by this multiplier.

The ADC conversion speed can be selected as needed in each of the above-mentioned embodiments. However, it is preferred that the conversion speeds of ADC 151a and ADC 151b are the same. Similarly, it is preferred that the conversion speeds of ADC 910a and ADC 910b are the same.

The distributor in each of the above-mentioned embodiments is not limited to a distributor that uses a resistor as illustrated as long as it distributes signals. For instance, it can also be a distributor that uses a waveguide tube.

Moreover, the structural elements of the phase noise measuring apparatus in each of the above-mentioned embodiments can actually be provided as hardware, or they can be virtually provided as software.

Moreover, the spectrum of phase signals can be found by wavelet conversion or spectrum analysis means other than FFT in each of the above-mentioned embodiments. Moreover, when the spectrum obtained by the spectrum analysis means corresponds to linearly spaced frequencies, mapping to logarithmically spaced frequencies can be performed on this spectrum. When the spectrum obtained by the spectrum analysis means already corresponds to logarithmically spaced frequencies, simple averaging in terms of frequency can be used as needed.

In addition, correlating device 150 in each of the above-mentioned embodiments analyzes the spectrum of each phase signal by finding the spectrum of each phase signal, and then finding the cross spectrum thereof to obtain the correlation spectrum between each phase signal. Correlating device 150 can also find the correlation between two input signals first and then analyze the resulting correlation spectrum and create a cross spectrum in place of the above-mentioned processing. The same changes can be made to correlating blocks 920, 930, and 940.

The method whereby a cross spectrum corresponding to linearly spaced frequencies is mapped to logarithmically spaced frequencies by vector averaging in terms of frequency in a device can be used for phase noise measuring apparatuses as well as other measuring apparatuses that use correlation or cross-spectrum processing. For instance, the above-mentioned method is effective for FFT analyzers that use correlation in order to reduce the effect of internal noise on measurement results. That is, vector analysis in the direction of frequency is also effective for mapping a cross spectrum of signals obtained by distribution of signals under test to logarithmically spaced frequencies. The same is true for methods whereby a spectrum that falls within a predetermined frequency range from logarithmically spaced frequencies is selected from spectra corresponding to linearly spaced frequencies and the selected spectrum is vector averaged. Moreover, the same can be applied to methods whereby vector averaging in the direction of frequency is performed on a spectrum corresponding to linearly spaced frequencies as the objects of averaging increase logarithmically with an increase in frequency.

What is claimed is:

1. A spectrum processing method whereby a spectrum obtained from signals under test and corresponding to linearly spaced frequencies is brought to correspond to logarithmically spaced frequencies by a measuring apparatus, said method comprising:

one step selected from the group consisting of:
(i) performing vector averaging on said spectrum selected from said spectra corresponding to linearly spaced frequencies;
(ii) selecting said spectrum within a predetermined frequency range from logarithmically spaced frequencies from said spectra corresponding to linearly spaced frequencies and performing vector averaging on the selected spectrum; and
(iii) performing vector averaging in terms of frequency on said spectrum corresponding to linearly spaced frequencies while logarithmically increasing the objects of averaging with an increase in frequency, and outputting a processing result of said vector averaging in terms of frequency to an output device, wherein performing vector averaging on said spectrum selected from said spectra corresponding to linearly spaced frequencies comprises performing vector averaging in terms of frequency on said spectrum selected from said spectra corresponding to linearly spaced frequencies, and wherein selecting said spectrum within a predetermined frequency range from logarithmically spaced frequencies from said spectra corresponding to linearly spaced frequencies and performing vector averaging on the selected spectrum comprises selecting said spectrum within a predetermined frequency range from logarithmically spaced frequencies from said spectra corresponding to linearly spaced frequencies and performing vector averaging in terms of frequency on the selected spectrum.

2. The method according to claim 1, wherein said spectrum is a cross spectrum obtained from signals distributed from signals under test.

3. A measuring apparatus for finding a spectrum obtained from signals under test and corresponding to linearly spaced frequencies, wherein said spectrum is brought to correspond to logarithmically spaced frequencies by a spectrum processing method whereby a spectrum obtained from signals under test and corresponding to linearly spaced frequencies is brought to correspond to logarithmically spaced frequencies by said measuring apparatus, the measuring apparatus comprising:

the measuring apparatus performs or selects one step selected from the group consisting of:

(i) performing vector averaging on said spectrum selected from said spectra corresponding to linearly spaced frequencies; (ii) selecting said spectrum within a predetermined frequency range from logarithmically spaced frequencies from said spectra corresponding to linearly spaced frequencies and performing vector averaging on the selected spectrum; and (iii) performing vector averaging in terms of frequency on said spectrum corresponding to linearly spaced frequencies while logarithmically increasing the objects of averaging with an increase in frequency, wherein performing vector averaging is performed by an averaging device, and wherein performing vector averaging on said spectrum selected from said spectra corresponding to linearly spaced frequencies comprises performing vector averaging in terms of frequency on said spectrum selected from said spectra corresponding to linearly spaced frequencies, and wherein selecting said spectrum within a predetermined frequency range from logarithmically spaced frequencies from said spectra corresponding to linearly spaced frequencies and performing vector averaging on the selected spectrum comprises selecting said spectrum within a predetermined frequency range from logarithmically spaced frequencies from said spectra corresponding to linearly spaced frequencies and performing vector averaging in terms of frequency on the selected spectrum.

4. The measuring apparatus of claim 3, wherein said spectrum is a cross spectrum that is brought to correspond to logarithmically spaced frequencies.

* * * * *